(12) United States Patent
Wada et al.

(10) Patent No.: US 8,759,983 B2
(45) Date of Patent: Jun. 24, 2014

(54) SEMICONDUCTOR DEVICE

(75) Inventors: Makoto Wada, Kanagawa (JP); Akihiro Kajita, Kanagawa (JP); Kazuyuki Higashi, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 375 days.

(21) Appl. No.: 12/361,979

(22) Filed: Jan. 29, 2009

(65) Prior Publication Data
US 2009/0206491 A1 Aug. 20, 2009

(30) Foreign Application Priority Data
Jan. 31, 2008 (JP) ................................. 2008-020373

(51) Int. Cl.
*H01L 29/41* (2006.01)
(52) U.S. Cl.
USPC .............. 257/775; 257/774; 257/E23.145; 257/E23.151; 257/E21.579; 257/E21.577; 257/E21.25; 257/E21.251; 438/638; 438/640; 438/673; 438/700; 438/701; 438/702
(58) Field of Classification Search
USPC .......... 257/774, 775, 773, E23.145, E23.151, 257/E23.175, E21.579, E21.585, E21.577, 257/E21.25, E21.251; 438/622, 638, 640, 438/675, 673, 700, 701, 702
See application file for complete search history.

(56) References Cited

U.S. PATENT DOCUMENTS

| 5,635,423 | A | * | 6/1997 | Huang et al. | 438/638 |
| 6,130,482 | A | | 10/2000 | Iio et al. | |
| 6,162,676 | A | * | 12/2000 | Mori | 438/253 |
| 6,753,608 | B2 | | 6/2004 | Tomita | |
| 7,019,400 | B2 | * | 3/2006 | Iguchi et al. | 257/758 |

(Continued)

FOREIGN PATENT DOCUMENTS

| JP | 7-211778 | 8/1995 |
| JP | 2000-208766 | 7/2000 |

(Continued)

OTHER PUBLICATIONS

U.S. Appl. No. 12/239,236, filed Sep. 26, 2008, Makoto Wada, et al.

(Continued)

*Primary Examiner* — Kimberly Rizkallah
*Assistant Examiner* — Maria Ligai
(74) *Attorney, Agent, or Firm* — Oblon, Spivak, McClelland, Maier & Neustadt, L.L.P.

(57) ABSTRACT

A semiconductor device according to one embodiment includes: a semiconductor substrate provided with a semiconductor element; a connecting member formed above the semiconductor substrate configured to electrically connect upper and lower conductive members; a first insulating film formed in the same layer as the connecting member; a wiring formed on the connecting member, the wiring including a first region and a second region, the first region contacting with a portion of an upper surface of the connecting member, and the second region located on the first region and having a width greater than that of the first region; and a second insulating film formed on the first insulating film so as to contact with at least a portion of the first region of the wiring and with a bottom surface of the second region.

13 Claims, 17 Drawing Sheets

(56) References Cited

U.S. PATENT DOCUMENTS

| | | |
|---|---|---|
| 7,378,340 B2 | 5/2008 | Enomoto et al. |
| 7,714,413 B2 | 5/2010 | Morimoto et al. |
| 7,884,011 B2 | 2/2011 | Morimoto et al. |
| 8,169,080 B2 | 5/2012 | Morimoto et al. |
| 2001/0029105 A1* | 10/2001 | Seta et al. .......... 438/694 |
| 2004/0026785 A1 | 2/2004 | Tomita |
| 2004/0203226 A1* | 10/2004 | Sakata et al. .......... 438/637 |
| 2006/0003577 A1 | 1/2006 | Sone |
| 2006/0234497 A1* | 10/2006 | Yang et al. .......... 438/638 |
| 2007/0007657 A1* | 1/2007 | Hineman et al. .......... 257/758 |
| 2007/0090447 A1 | 4/2007 | Morimoto et al. |
| 2007/0145567 A1* | 6/2007 | Ning .......... 257/691 |
| 2009/0141424 A1* | 6/2009 | Barth et al. .......... 361/311 |
| 2010/0167525 A1 | 7/2010 | Morimoto et al. |
| 2011/0101530 A1 | 5/2011 | Morimoto et al. |

FOREIGN PATENT DOCUMENTS

| | | |
|---|---|---|
| JP | 2000-349151 | 12/2000 |
| JP | 2002-141412 | 5/2002 |
| JP | 2003-188252 | 7/2003 |
| JP | 2004-79596 | 3/2004 |
| JP | 2007-27571 | 2/2007 |
| JP | 2007-123328 | 5/2007 |

OTHER PUBLICATIONS

Japanese Office Action issued Apr. 27, 2012, in Japan Patent Application No. 2008-020373 (with English translation).

Office Action issued Oct. 1, 2013 in Japanese Application No. 2012-140005 (With English Translation).

* cited by examiner

SEMICONDUCTOR DEVICE

CROSS-REFERENCE TO RELATED APPLICATIONS

This application is based upon and claims the benefit of priority from prior Japanese Patent Application No. 2008-020373, filed on Jan. 31, 2008, the entire contents of which are incorporated herein by reference.

BACKGROUND

In a wiring structure of a semiconductor device, an etching stopper film is generally used for equalizing the depth when forming a wiring trench or a via hole or the like by etching and for suppressing overetching to an interlayer insulating film which is a lower layer. This wiring structure, for example, is disclosed in JP-A-2006-19480.

BRIEF SUMMARY

A semiconductor device according to one embodiment includes: a semiconductor substrate provided with a semiconductor element; a connecting member formed above the semiconductor substrate configured to electrically connect upper and lower conductive members; a first insulating film formed in the same layer as the connecting member; a wiring formed on the connecting member, the wiring including a first region and a second region, the first region contacting with a portion of an upper surface of the connecting member, and the second region located on the first region and having a width greater than that of the first region; and a second insulating film formed on the first insulating film so as to contact with at least a portion of the first region of the wiring and with a bottom surface of the second region.

A semiconductor device according to another embodiment includes: a semiconductor substrate provided with a semiconductor element; a connecting member formed above the semiconductor substrate configured to electrically connecting upper and lower conductive members; a first insulating film formed in the same layer as the connecting member; a wiring formed on the connecting member, the wiring including a first region, a second region and third region, the first region contacting with a portion of an upper surface of the connecting member, the second region located on the first region and having a width greater than that of the first region, and the third region located between the first region and the second region and having a concave shape with a curved surface or a taper shape; and a second insulating film formed on the first insulating film so as to contact with the third region of the wiring.

A semiconductor device according to another embodiment includes: a semiconductor substrate provided with a semiconductor element; a first and second connecting member formed above the semiconductor substrate configured to electrically connect upper and lower conductive members, respectively; a first insulating film formed in the same layer as the first and second connecting members; a first wiring formed on the first connecting member, the first wiring including a first region and second region, the first region contacting with a portion of an upper surface of the first connecting member, and the second region located on the first region and having a width greater than that of the first region; a second wiring formed on the second connecting member, the first wiring including a first region and second region, the first region contacting with a portion of an upper surface of the first connecting member, and the second region located on the first region and having a width greater than that of the first region, and the second wiring provided adjacent to the first wiring and substantially parallel to the first wiring; and a second insulating film formed on the first insulating film so as to contact with at least a portion of the first region of the first wiring, a portion of the first region of the second wiring and with a bottom surface of the second region of the first wiring and the second wiring; wherein a horizontal distance from the first connecting member to the first region of the second wiring is greater than a horizontal distance from the first connecting member to the second region of the second wiring.

BRIEF DESCRIPTION OF THE DRAWING

FIGS. 1A and 1B are diagrams showing a semiconductor device according to a first embodiment, wherein FIG. 1A is a cross sectional view and FIG. 1B is a perspective view showing only wirings and contacts;

FIG. 7A is an enlarged partial view showing a periphery of the wiring of the semiconductor device according to the second embodiment and FIG. 73 is an enlarged partial view showing a periphery of a wiring of a semiconductor device which has a conventional wiring not having a two-stage structure as a second comparative example;

DETAILED DESCRIPTION

First Embodiment

Figure 1A:
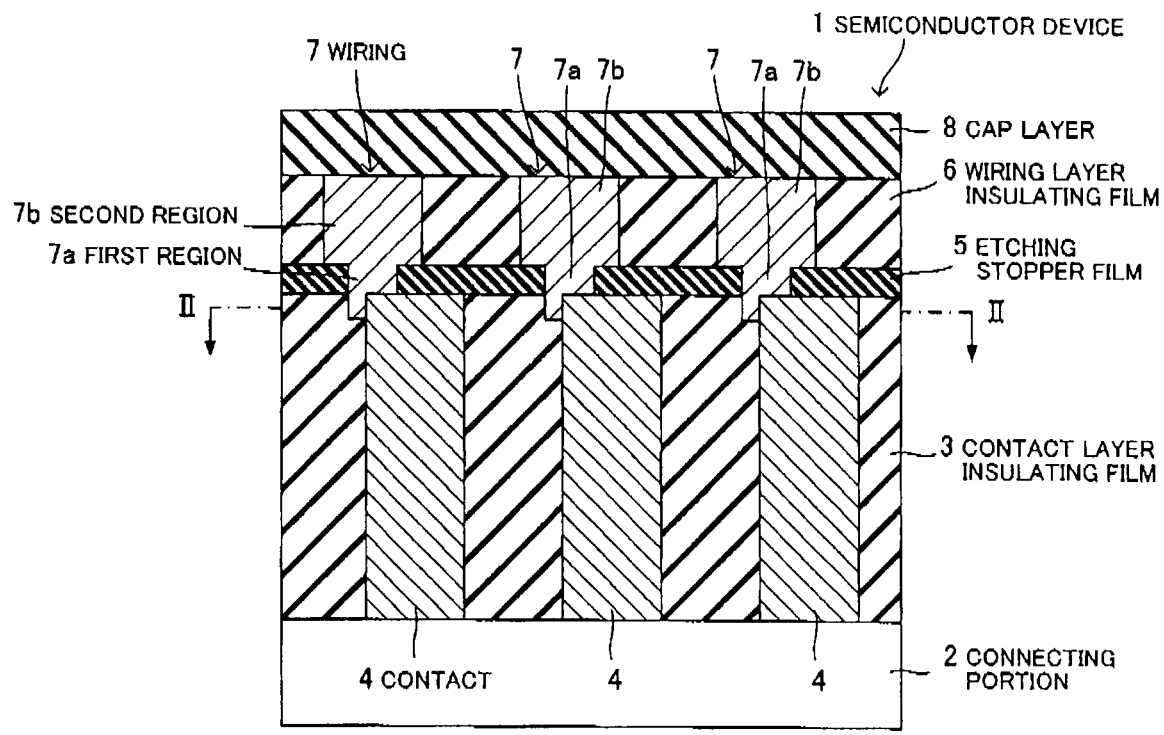
Figure 1B:
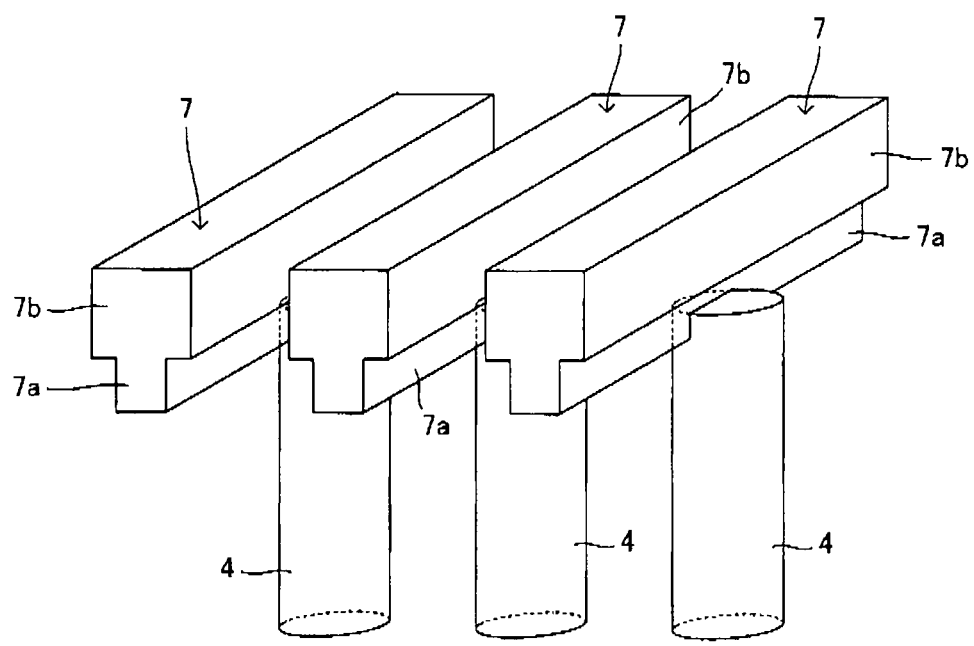
Figure 2A:
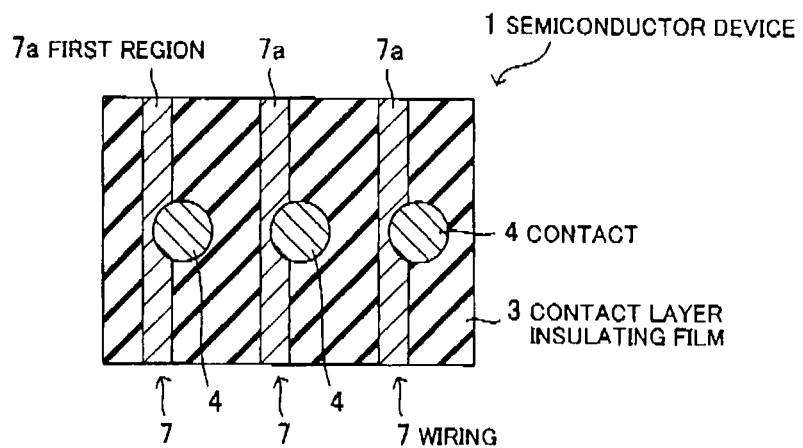
FIG. 2A and FIG. 2B are cross sectional views when a cut surface taken on line II-II of FIG. 1A is viewed in a direction indicated by an arrow in the figure.
Figure 2B:
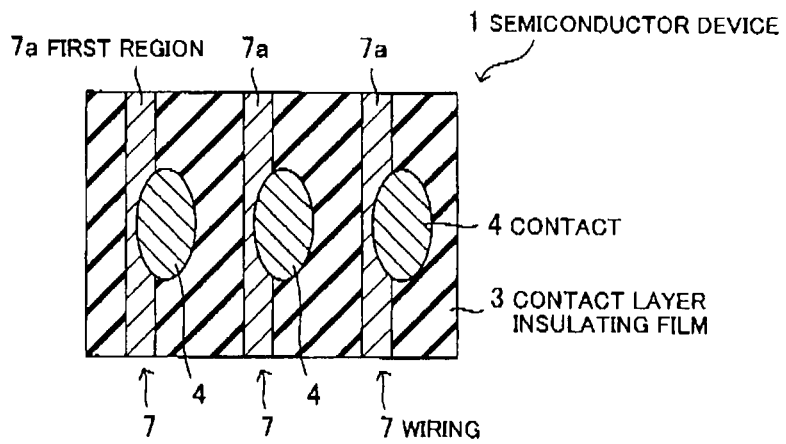

FIG. 1A is a cross sectional view showing a semiconductor device according to a first embodiment and FIG. 1B is a perspective view showing only wirings and contacts. In addition, FIG. 2A and FIG. 2B are cross sectional views when a cut surface taken on line II-II of FIG. 1A is viewed in a direction indicated by an arrow in the figure.

A semiconductor device 1 has a semiconductor substrate having a semiconductor element on a surface thereof and a multilayer wiring structure laminated on the semiconductor substrate. FIG. 1A is a cross sectional view showing a portion of the multilayer wiring structure.

The semiconductor device 1 includes a connecting portion 2, a contact 4 electrically connected to the connecting portion 2, a contact layer insulating film 3 formed on the same layer as the contact 4, a wiring 7 formed on the contact 4 so as to contact with a portion of an upper surface of the contact 4, an etching stopper film 5 formed on the contact layer insulating film 3 so as to contact with a portion of the side face of the wiring 7, a wiring layer insulating film 6 formed on the etching stopper film 5 so as to contact with a portion of the side face of the wiring 7, and a cap layer 8 formed on the upper surfaces of the wiring 7 and the wiring layer insulating film 6. Note that, a layout of the contact 4 or the wiring 7, etc., is not limited to that shown in FIGS. 1A and 1B.

The connecting portion 2 is a contact portion of a semiconductor substrate or a semiconductor element, etc. Concretely, the connecting portion 2 is, e.g., a source/drain region of a transistor, a contact portion of a gate electrode, or a metal wiring.

The wiring 7 is made of, e.g., a conductive material such as Cu, etc. Note that, the wiring 7 may have a structure having a barrier metal on the surface thereof for preventing diffusion of metals in the wiring 7. The barrier metal is made of, e.g., a metal such as Ta, Ti, W, Ru or Mn, etc, or a compound thereof.

In addition, the wiring 7 has a two-stage structure composed of a first region 7a which is a region located lower than a height of an upper surface of the etching stopper film 5 and contacting with a portion of the upper surface of the contact 4, and a second region 7b located on the first region 7a and having a width larger than that of the first region 7a. At least an upper portion of the side face of the first region 7a contacts with the side face of the etching stopper film 5, and a bottom surface of the second region 7b, which is generated by a difference in width between the first region 7a and the second region 7b, contacts with the upper surface of the etching stopper film 5. In addition, a portion of the first region 7a is displaced from the top of the contact 4 in a width direction in a region to which the contact 4 is connected.

Note that, an aspect ratio (height/width) of the first region 7a is preferably less than 5 in order to ensure the ease of embedding the wiring material. Furthermore, the thinner the thickness of the etching stopper film 5, the better the embedding property of the wiring material. For example, 40 nm or less in thickness is preferable.

The contact 4 is made of, e.g., a conductive material such as W, Cu or Al, etc. Similarly to the wiring 7, the contact 4 may have a structure having a barrier metal on the surface thereof for preventing diffusion of metals in the contact 4. Furthermore, a shape of a cross section of the contact 4 may be a nearly perfect circle as shown in FIG. 2A or an elliptical shape as shown in FIG. 2B.

The contact layer insulating film 3 is made of, e.g., TEOS (Tetraethoxysilane) or Si oxide such as $SiO_2$, SiOC which is C-doped $SiO_2$, SiON which is N-doped $SiO_2$, SiOF which is F-doped $SiO_2$, BPSG which is B and P-doped $SiO_2$ or the like. Furthermore, an organic insulating material such as SiOCH, polymethylsiloxane, polyarylene or benzoxazole, etc., may be used.

For a material of the wiring layer insulating film 6, it is possible to use the same material as the contact layer insulating film 3.

The etching stopper film 5 is made of an insulating material such as SiN, SiC, SiOC, SiCN or SiON, etc. In addition, since the etching stopper film 5 functions as an etching stopper when etching the wiring layer insulating film 6, it is preferable that the material of the etching stopper film 5 has a high etching selectivity with respect to the wiring layer insulating film 6.

The cap layer 8 is made of an insulating material such as SiC, SiOC or SiN, etc.

Figure 3A:
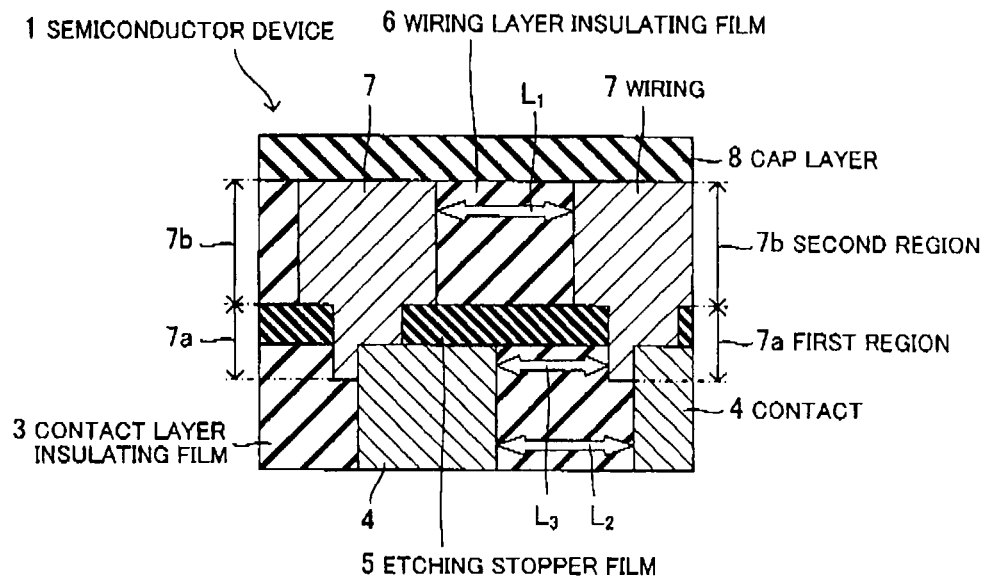
FIG. 3A is an enlarged partial view showing a periphery of the wiring of the semiconductor device according to the first embodiment and FIG. 3B is an enlarged partial view showing a periphery of a wiring of a semiconductor device which has a conventional wiring not having a two-stage structure as a first comparative example.
Figure 3B:
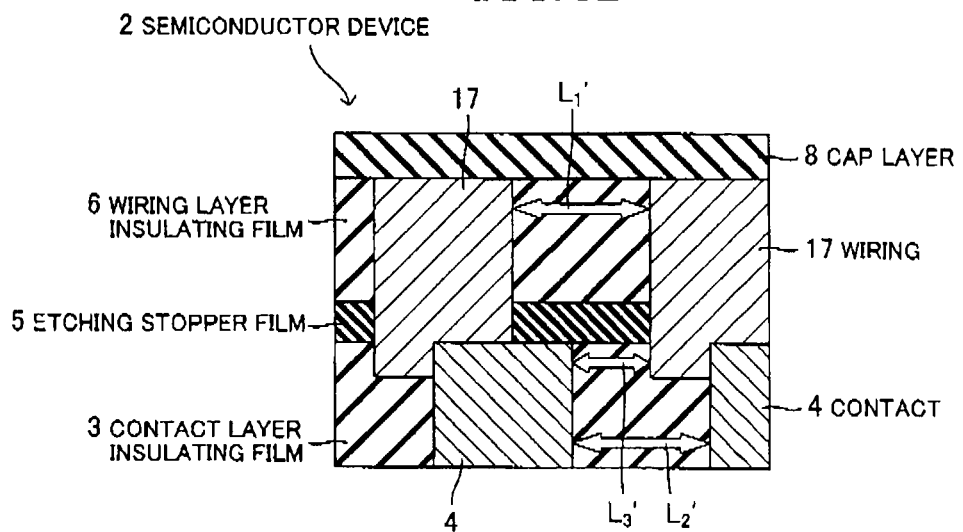

FIG. 3A is an enlarged partial view showing a periphery of the wiring 7 of the semiconductor device 1 according to the present embodiment. In addition, FIG. 3B is an enlarged partial view showing a periphery of a wiring 17 of a semiconductor device 2 which has a wiring 17 not having a two-stage structure as a first comparative example.

Here, in the semiconductor device 1, a distance between the second regions 7b of the adjacent wirings 7 is an inter-wiring distance $L_1$, a distance between the adjacent contacts 4 is an inter-contact distance $L_2$, and a distance between the contact 4 and the first region 7a of the adjacent wiring 7 is a contact-to-wiring distance $L_3$. In addition, in the semiconductor device 2, a distance between the adjacent wirings 17 is an inter-wiring distance $L_1'$, a distance between the adjacent contacts 4 is an inter-contact distance $L_2'$, and a distance between the contact 4 and the adjacent wiring 17 is a contact-to-wiring distance $L_3'$. In addition, the inter-wiring distance $L_1$ is equal to the inter-wiring distance $L_1'$ and the inter-contact distance $L_2$ is equal to the inter-contact distance $L_2'$.

Note that, in the semiconductor device 1 shown in FIG. 3A, a width of the second region 7b of the wiring 7 is equal to a diameter of the contact 4 in a width direction of the second regions 7b, in other words, the inter-wiring distance $L_1$ is equal to the inter-contact distance $L_2$. In addition, in the semiconductor device 2 shown in FIG. 3B, a width of the wiring 17 is equal to a diameter of the contact 4 in a width direction of the wiring 17, in other words, the inter-wiring distance $L_1'$ is equal to the inter-contact distance $L_2'$.

If a displacement of formation positions of the wiring and the contact does not occur, the inter-wiring distance and the inter-contact distance are a distance of closest approach between the adjacent conductive members. When an electric field is applied between the conductive members, a leak current and a breakdown are likely to occur at the point where the distance between the conductive members is closest, Thus, the wiring and the contact are formed so that the inter-wiring distance and the inter-contact distance are a distance to suppress the generation of the leak current and the breakdown. However, in miniaturized wiring structure, the displacement of the formation positions of the wiring and the contact often occurs due to a problem such as matching accuracy of lithography, etc.

In the semiconductor device 2 shown in FIG. 3B, the formation positions of the wiring 17 and the contact 4 are displaced, thus, the contact-to-wiring distance $L_3'$ is shorter than the inter-wiring distance $L_1'$ and the inter-contact distance $L_2'$. In other words, the contact-to-wiring distance $L_3'$ is a distance of closest approach between the adjacent conductive members. Consequently, even if the inter-wiring distance $L_1'$ and the inter-contact distance $L_2'$ are set to be larger than a limit distance $L_{lim}$, which is a minimum distance for suppressing the generation of the leak current and the breakdown, the contact-to-wiring distance $L_3'$ may become shorter than the limit distance $L_{lim}$, ($L_3' < L_{lim < L1}' = L_2'$). Note that, the limit distance $L_{lim}$ differs depending on a difference in the electrical potential applied between the adjacent conductive members.

Meanwhile, in the semiconductor device 1 according to the first embodiment shown in FIG. 3A, since the wiring 7 has a two-stage structure composed of the first region 7a and the second region 7b, the contact-to-wiring distance $L_3$ is larger than the contact-to-wiring distance $L_3'$ of the semiconductor device 2. The contact-to-wiring distance $L_3$ can be increased to be larger than the limit distance $L_{lim}$ by adjusting the width of the second region 7b ($L_{lim} < L_3 < L_1 = L_2$).

Note that, in the semiconductor device 1 according to the first embodiment, when each of a width of the second region 7b of the wiring 7, a diameter of the contact 4 in the width direction of the second region 7b and dimensions of the inter-wiring distance $L_1$ and the inter-contact distance $L_2$ is f, a width of the first region 7a of the wiring 7 is Xf (0<X<1), and a displacement of formation positions of the wiring 7 (the second region 7b) and the contact 4 in the width direction of the wiring 7 is Z, the contact-to-wiring distance $L_3$ as a distance of closest approach between the adjacent conductive members is represented by following formula (1).

$$L_3 = \frac{(3-x)}{2}f - z \quad (1)$$

In addition, in the semiconductor device 2, when each of a width of the wiring 17, a diameter of the contact 4 in the width direction of the wiring 17 and dimensions of the inter-wiring distance $L_1'$ and the inter-contact distance $L_2'$ is f and a displacement of formation position of the wiring 17 and the contact 4 in the width direction of the wiring 17 is Z, the contact-to-wiring distance $L_3'$ is represented by following formula (2).

$$L_3' = f - Z \quad (2)$$

Therefore, in this case, compared with the semiconductor device 2, the distance of closest approach between the adjacent conductive members in the semiconductor device 1 is larger by ΔL, which is represented by following formula (3).

$$\Delta L = L_3 - L_3' = \frac{(1-x)}{2}f \quad (3)$$

Alternatively, in the semiconductor device 1, the width of the second region 7b of the wiring 7 is not necessarily equal to the diameter of the contact 4 in the width direction of the wiring 7 as long as relations $L_{lim} < L_1$ and $L_{lim} < L_3 < L_2$ are satisfied. Therefore, $L_1 \neq L_2$ is acceptable.

Figure 4A:
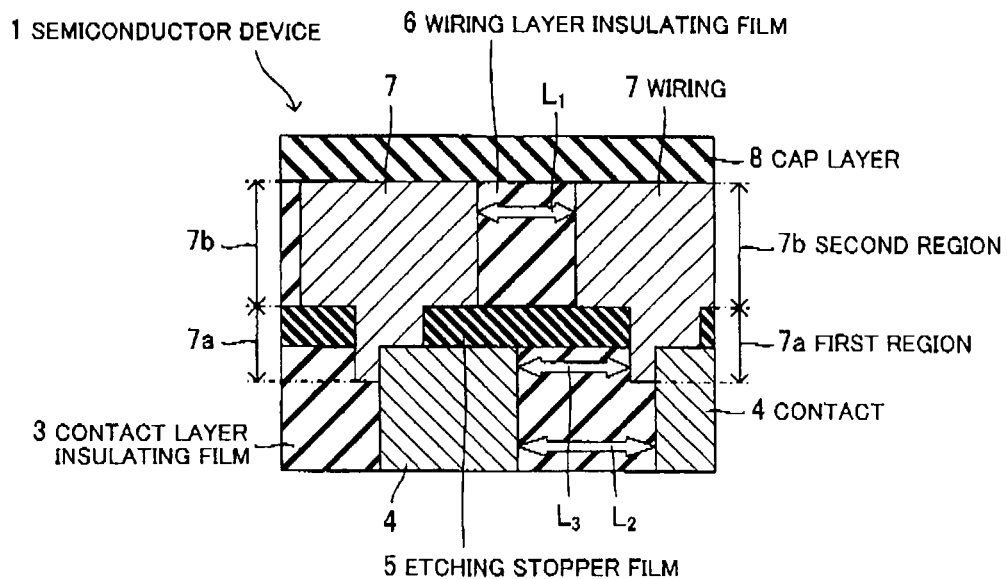
FIG. 4A and FIG. 4B are cross sectional views showing a modification of the semiconductor device according to the first embodiment.
Figure 4B:
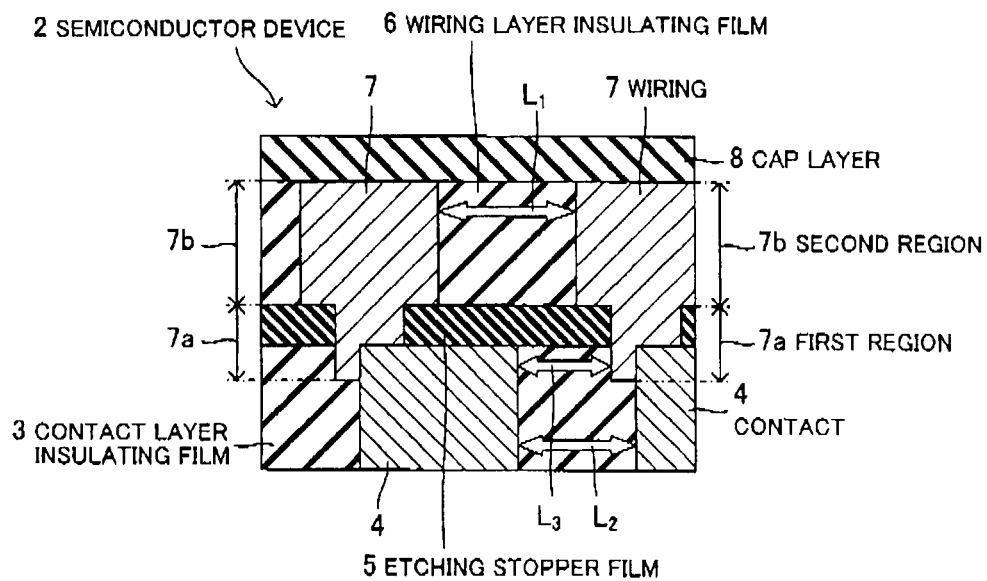

For example, as shown in FIG. 4B, the width of the second region 7b of the wiring 7 may be increased to be larger than the diameter of the contact 4 in the width direction of the second region 7b. It is possible to lower electrical resistivity in the wiring 7 by increasing the width of the second region 7b. Furthermore, since the embedding property of the material is improved by increasing the width of the second region 7b, formation of the wiring 7 is facilitated. In addition, when a distance of closest approach between the adjacent conductive members is a distance between the adjacent second regions 7b and is not determined by the displacement of the formation positions of the wiring 7 and the contact 4 in the width direction, the distance of closest approach between the adjacent conductive members is not determined by the matching accuracy of lithography, but determined only by a dimensional accuracy of the second region 7b of the wiring 7. Since the dimension of the second region 7b is determined only by lithography resolution and a processing accuracy and it is possible to adjust with a minute accuracy down to about 1 nm, the dimension of the second region 7b can be easily set to be a desired dimension. Thus, it possible to more easily control the generation of the leak current and the breakdown by increasing the width of the second region 7b so that the inter-wiring distance $L_1$ is a distance of closest approach.

As shown in FIGS. 4A and 4B, a horizontal distance from the first connecting member 4 (left contact 4 in FIGS. 4A and 4B) to the first region of the second wiring 7 (right wiring 7 in FIGS. 4A and 4B) is greater than a horizontal distance from the first connecting member 4 to the second region of the second wiring 7. So, the leak current and the possibility of breakdown may be reduced.

Alternatively, for example, the diameter of the contact 4 in the width direction of the wiring 7 may be increased, as shown in FIG. 4B. It is possible to lower electrical resistivity in the contact 4 by increasing the diameter of the contact 4. Furthermore, since the embedding of the material is facilitated, formation of the contact 4 is facilitated.

An example of the processes for fabricating the semiconductor device 1 according to the present embodiment will be described hereinafter.

FIG. 5A to FIG. 5F are cross sectional views showing processes for fabricating the semiconductor device according to the first embodiment.

Figure 5A:
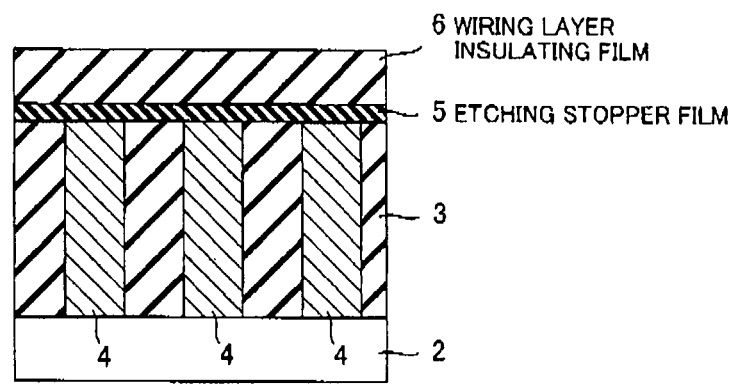
FIG. 5A to FIG. 5F are cross sectional views showing processes for fabricating the semiconductor device according to the first embodiment.

Firstly, as shown in FIG. 5A, after forming the contact 4 in the contact layer insulating film 3 on the connecting portion 2, the etching stopper film 5 and the wiring layer insulating film 6 are sequentially formed thereon.

Here, after forming the contact layer insulating film 3 by a CVD (Chemical Vapor Deposition) method, etc., the contact layer insulating film 3 is patterned by, e.g., a photolithographic method and an RIE (Reactive Ion Etching) method, which results in that a contact hole for the contact 4 is formed in the contact layer insulating film 3.

Then, after forming a contact material in the contact hole which is formed in the contact layer insulating film 3, excess of the upper portion is removed by applying planarization treatment such as CMP (Chemical Mechanical Polishing), etc., which results in that the contact 4 is formed. At this time, for example, when using W for the contact material, for example, after forming a TiN film as a barrier metal by the CVD method, W is formed by the ALD (Atomic Layer Deposition) method or the plasma CVD method.

In addition, the etching stopper film 5 and the wiring layer insulating film 6 are formed by the CVD method, etc.

Figure 5B:
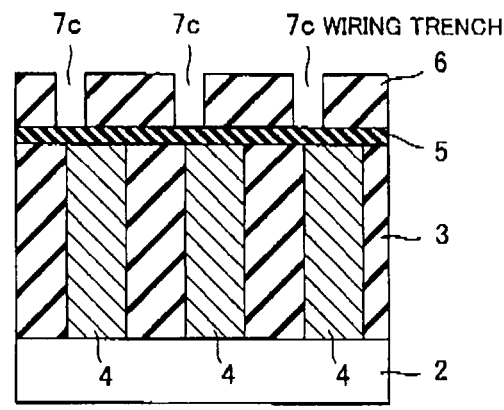

Next, as shown in FIG. 5B, a wiring trench 7c for the wiring 7 is formed in the wiring layer insulating film 6 by, e.g., patterning the wiring layer insulating film 6 by the photolithographic method and the RIE method. At this time, the depths of the wiring trenches 7c are equalized by the etching stopper film 5.

Figure 5C:
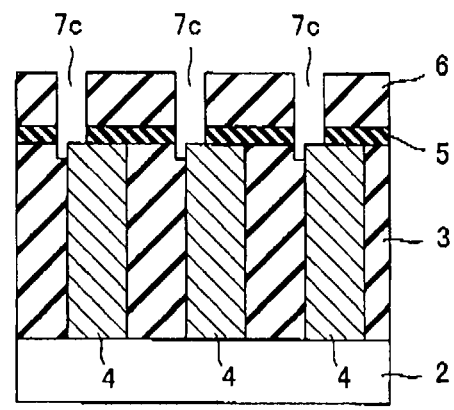

Next, as shown in FIG. 5C, the wiring trench 7c is deepened by removing the etching stopper film 5 under the wiring trench 7c, which results in that at least a portion of the upper surface of the contact 4 is exposed. At this time, as shown in FIG. 5C, a portion of the contact layer insulating film 3 partially removed by the displacement of the formation positions of the contact 4 and the wiring trench 7c may be a portion of the wiring trench 7c.

Figure 5D:
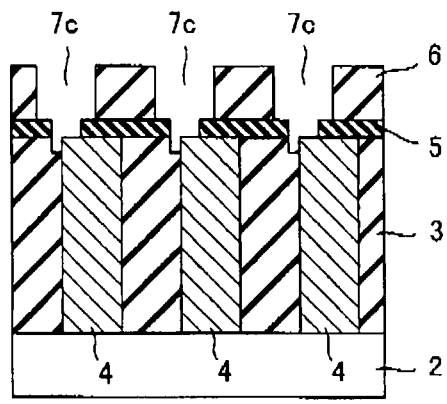

Next, as shown in FIG. 5D, the wiring layer insulating film 6 is etched using the etching stopper film 5 as a stopper by, e.g., the RIE method or a wet etching having process selectivity with respect to the etching stopper film 5, thereby increasing a width of a region of the wiring trench 7c located higher than the height of the upper surface of the etching stopper film 5.

Figure 5E:
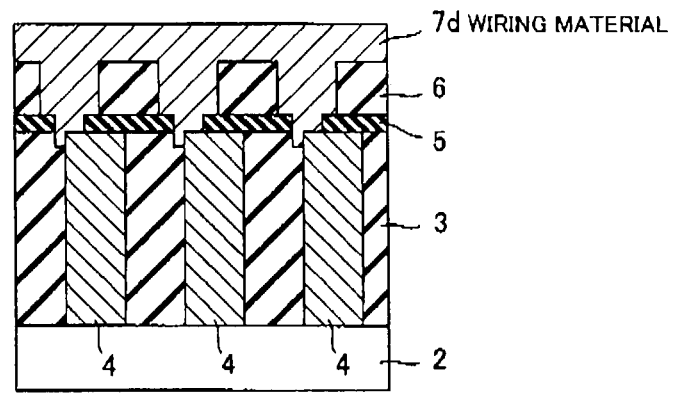

Next, as shown in FIG. 5E, a wiring material 7d is formed in the wiring trench 7c. For example, when using Cu as the wiring material 7d, the wiring material 7d is formed by forming, e.g., a Ti or Ta film as a barrier metal by a sputtering method, etc., sequentially forming a Cu seed film by the sputtering method, and then, plating a Cu film thereon.

Figure 5F:
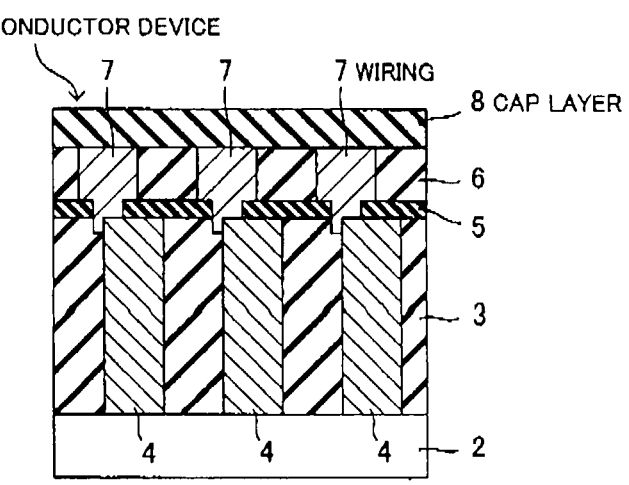

Next, as shown in FIG. 5F, excess of the upper portion of the wiring material 7d is removed by applying a planarization treatment such as the CMP, etc., to the wiring material 7d, which result in that the wiring 7 is formed, Here, in the wiring 7, a region located lower than the height of the upper surface of the etching stopper film 5 is the first region 7a, and a region located higher than the height of the upper surface of the etching stopper film 5 is the second region 7b. After that, the cap layer 8 is formed on the wiring layer insulating film 6 and the wiring 7 by the CVD method, etc.

Effect of the First Embodiment

According to the semiconductor device 1 of the first embodiment, since the wiring 7 has a two-stage structure composed of the first region 7a and the second region 7b, even when the displacement of the formation positions of the wiring 7 and the contact 4 occurs, it is possible to suppress the generation of the leak current and the breakdown by increasing the contact-to-wiring distance $L_3$ which is a distance of closest approach between the conductive members.

Furthermore, since the wiring 7 has a two-stage structure composed of the first region 7a and the second region 7b, the embedding of the material at the time of forming the wiring is facilitated compared with the case where the distance of closest approach between the conductive members is decreased by decreasing the width of the entire wiring, and it is thereby possible to suppress deterioration of the electrical characteristics due to generation of voids in the wiring, etc.

Second Embodiment

In the second embodiment, the displacement of the formation positions of the contact 4 and the wiring 7 is smaller than that of the first embodiment. The explanation will be omitted for the points same as the first embodiment.

Figure 6A:
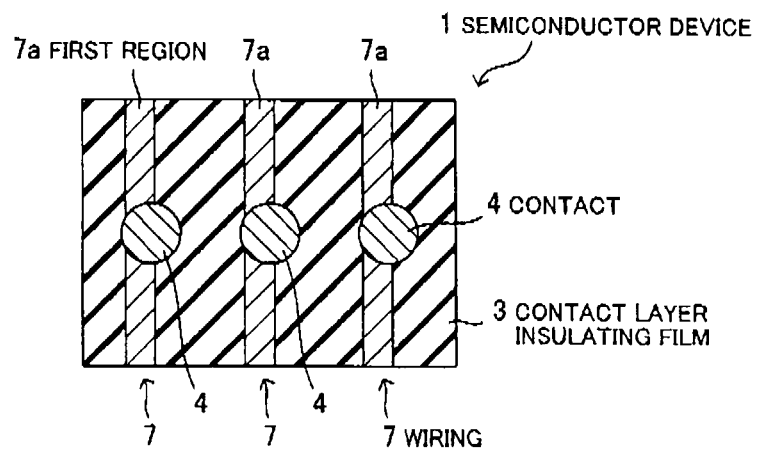
FIG. 6A and FIG. 6B are cross sectional views showing a semiconductor device according to a second embodiment.
Figure 6B:
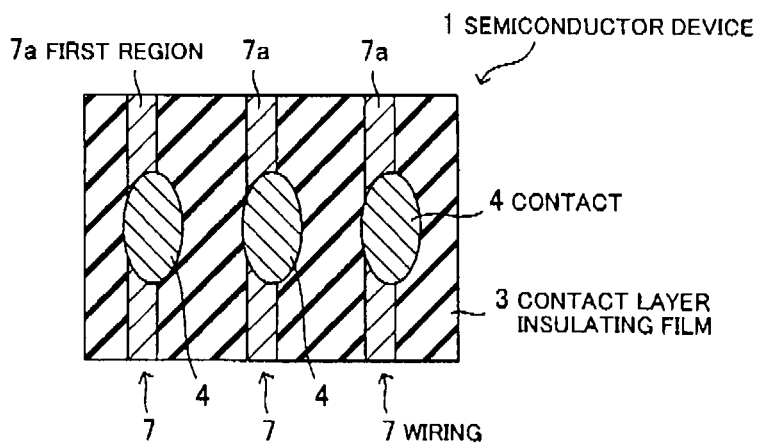

FIG. 6A and FIG. 6B are cross sectional views showing the semiconductor device according to a second embodiment. Here, cross sections of the semiconductor device 1 according to the present embodiment shown in FIG. 6A and FIG. 6B each correspond to the cross sections of the semiconductor device 1 according to the first embodiment shown in FIG. 2A and FIG. 2B.

The shape of the cross section of the contact 4 may be a nearly perfect circle as shown in FIG. 6A or an elliptical shape as shown in FIG. 6B.

Figure 7A:
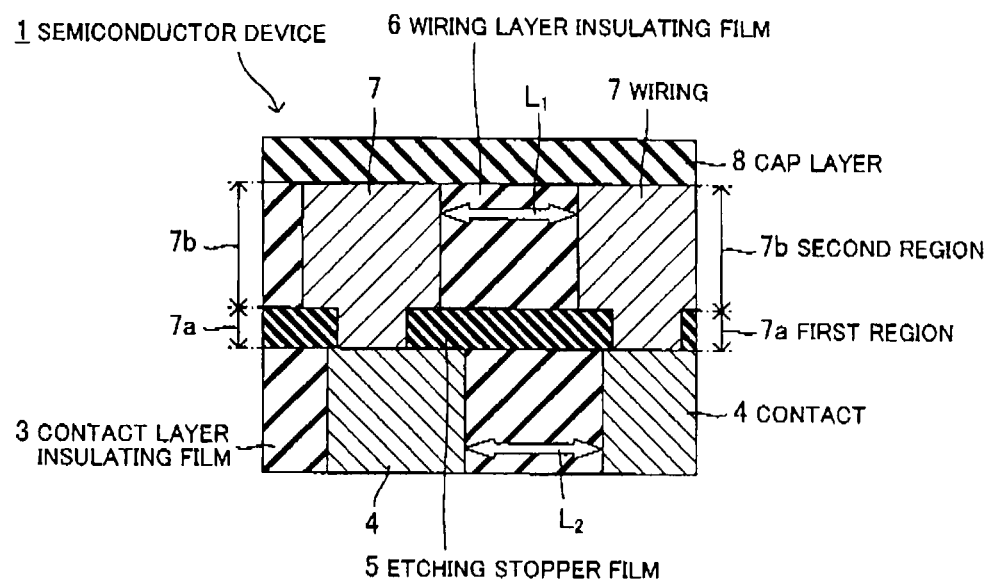
Figure 7B:
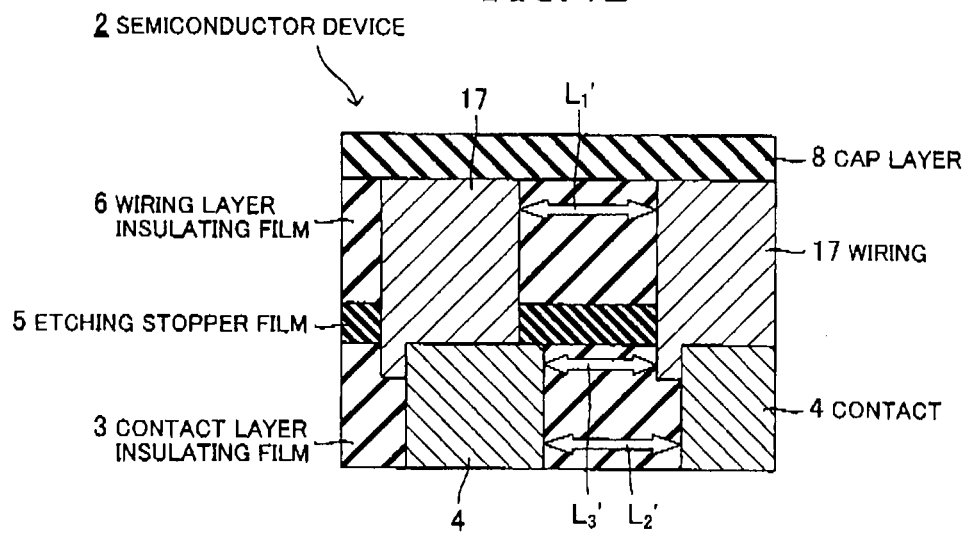

FIG. 7A is an enlarged partial view showing a periphery of the wiring 7 of the semiconductor device 1 according to the present embodiment. In addition, FIG. 7B is an enlarged partial view showing a periphery of a wiring 17 of a semiconductor device 2 which has a conventional wiring 17 not having a two-stage structure as a second comparative example. Here, cross sections of the semiconductor device 1 according to the embodiment shown in FIG. 7A and FIG. 7B each correspond to the cross sections of the semiconductor device 1 according to the first embodiment shown in FIG. 3A and FIG. 3B. Note that, the semiconductor device 2 is totally same as the semiconductor device 1 in a structure and an arrangement of each member, etc., except a structure of the wiring.

Here, in the semiconductor device 1, a distance between the second regions 7b of the adjacent wirings 7 is an inter-wiring distance $L_1$ and a distance between the adjacent contacts 4 is an inter-contact distance $L_2$. In the present embodiment, since the first region 7a of the wiring 7 is not displaced from the top of the contact 4 in a width direction in a region to which the contact 4 is connected, unlike the first embodiment, the contact 4 and a portion of the first region 7a are not located at the same height. Therefore, anything which corresponds to the contact-to-wiring distance $L_3$ of the first embodiment does not exist.

In addition, in the semiconductor device 2, a distance between the adjacent wirings 17 is an inter-wiring distance $L_1'$, a distance between the adjacent contacts 4 is an inter-contact distance $L_2'$, and a distance between the contact 4 and the adjacent wiring 17 is a contact-to-wiring distance $L_3'$. In addition, the inter-wiring distance $L_1$ is equal to the inter-wiring distance $L_1'$ and the inter-contact distance $L_2$ is equal to the inter-contact distance $L_2'$.

Note that, in the semiconductor device 1 shown in FIG. 7A, a width of the second region 7b of the wiring 7 is equal to a diameter of the contact 4 in a width direction of the second region 7b, in other words, the inter-wiring distance $L_1$ is equal to the inter-contact distance $L_2$. In addition, in the semiconductor device 2 shown in FIG. 7B, a width of the wiring 17 is equal to a diameter of the contact 4 in a width direction of the wiring 17, in other words, the inter-wiring distance $L_1'$ is equal to the inter-contact distance $L_2'$.

In the semiconductor device 2 shown in FIG. 7B, the formation positions of the wiring 17 and the contact 4 are displaced, thus, the contact-to-wiring distance $L_3'$ is shorter than the inter-wiring distance $L_1'$ and the inter-contact distance $L_2'$. In other words, the contact-to-wiring distance $L_3'$ is a distance of closest approach between the adjacent conductive members. Consequently, even if the inter-wiring distance $L_1'$ and the inter-contact distance $L_2'$ are set to be larger than a limit distance $L_{lim}$ which is a minimum distance for suppressing the generation of the leak current and the breakdown, the contact-to-wiring distance $L_3'$ may become shorter than the limit distance $L_{lim}$ ($L_3' < L_{lim} < L_1' = L_2'$).

Meanwhile, in the semiconductor device 1 according to the second embodiment shown in FIG. 7A, since the wiring 7 has a two-stage structure composed of the first region 7a and the second region 7b, even though the displacement of the formation positions of the wiring 7 and the contact 4 occurs, the first region 7a is not displaced from the top of the contact 4 in a width direction, thus, the inter-wiring distance $L_1$ and the inter-contact distance $L_2$ become the distance of closest approach between the adjacent conductive members. Therefore, when the inter-wiring distance $L_1$ and the inter-contact distance $L_2$ are set to be larger than the limit distance $L_{lim}$, the distance of closest approach between the conductive members is larger than the limit distance $L_{lim}$, ($L_{lim} < L_1 = L_2$).

Note that, in the semiconductor device 1 according to the present embodiment, when each of a width of the second region 7b of the wiring 7, a diameter of the contact 4 in the width direction of the second region 7b and dimensions of the inter-wiring distance $L_1$ and the inter-contact distance $L_2$ is f, a width of the first region 7a of the wiring 7 is Xf (0<X<1), and a displacement of formation positions of the wiring 7 (the second region 7b) and the contact 4 in the width direction of the wiring 7 is Z, the distance of closest approach between the adjacent conductive members is f, which is the inter-wiring distance $L_1$ and the inter-contact distance $L_2$.

In addition, in the semiconductor device 2, when each of a width of the wiring 17, a diameter of the contact 4 in the width direction of the wiring 17 and dimensions of the inter-wiring distance $L_1'$ and the inter-contact distance $L_2'$ is f and a displacement of formation positions of the wiring 17 and the contact 4 in the width direction of the wiring 17 is Z, the contact-to-wiring distance $L_3'$ is represented by following formula (4).

$$L_3' = f - Z \quad (4)$$

Therefore, in this case, compared with the semiconductor device 2, the distance of closest approach between the adjacent conductive members in the semiconductor device 1 is larger by ΔL, which is represented by following formula (5).

$$\Delta L = L_1 - L_3' = Z \quad (5)$$

Alternatively, in the semiconductor device 1, the width of the second region 7b of the wiring 7 is not necessarily equal to the diameter of the contact 4 in the width direction of the second region 7b as long as relations $L_{lim} < L_1$ and $L_{lim} < L_2$ are satisfied. Therefore, $L_1 \neq L_2$ is acceptable.

Figure 8A:
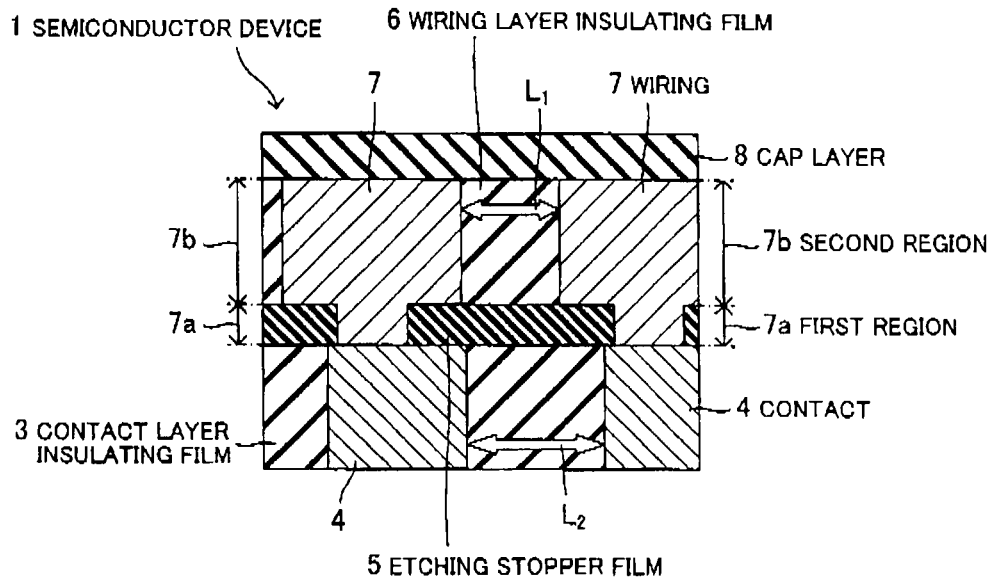
FIG. 8A and FIG. 8B are cross sectional views showing a modification of the semiconductor device according to the second embodiment.
Figure 8B:
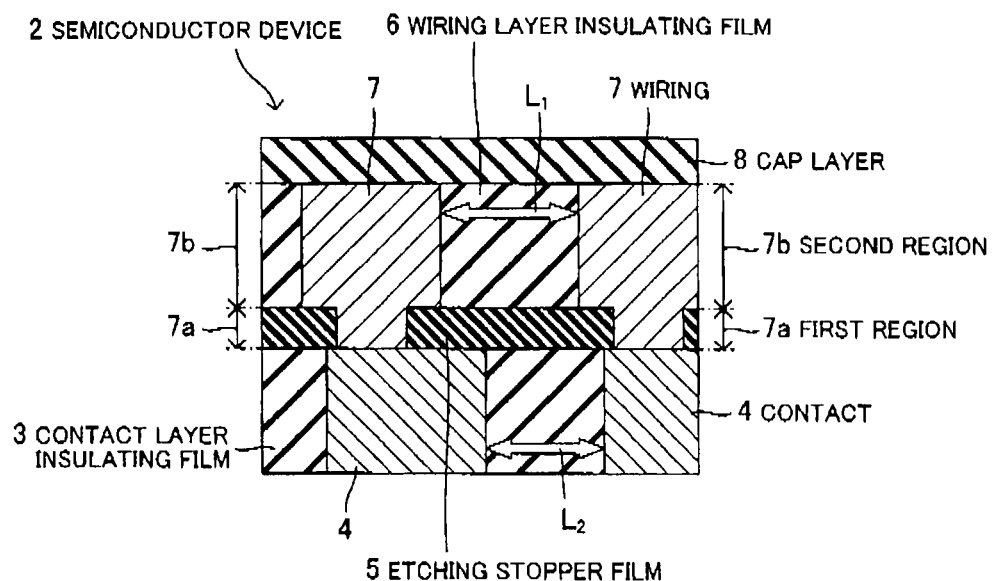

For example, as shown in FIG. 8A, the width of the second region 7b of the wiring 7 may be increased. Alternatively, for example, the diameter of the contact 4 in the width direction of the wiring 7 may be increased, as shown in FIG. 8B. The effect of increasing the width of the second region 7b of the wiring 7 or the diameter of the contact 4 in the width direction of the wiring 7 is same as the first embodiment.

Effect of the Second Embodiment

According to the semiconductor device 1 of the second embodiment, since the wiring 7 has a two-stage structure composed of the first region 7a and the second region 7b, even when the displacement of the formation positions of the wiring 7 and the contact 4 occurs, the distance of closest approach between the adjacent conductive members is not the contact-to-wiring distance, but the inter-wiring distance $L_1$ and (or) the inter-contact distance $L_2$. Therefore, the distance of closest approach between the adjacent conductive members is not determined by the matching accuracy of lithography, but determined only by a dimensional accuracy of the second region 7b of the wiring 7 and the contact 4. Since the dimension of the second region 7b and the contact 4 are determined only by lithography resolution and a processing accuracy and it is possible to adjust with a minute accuracy down to about 1 nm, the dimension of the second region 7b and the contact 4 can be easily set to be a desired dimension. Thus, it possible to more easily control the generation of the leak current and the breakdown by increasing the width of the second region 7b and (or) the diameter of the contact 4 so that the inter-wiring distance $L_1$ and (or) the inter-contact distance $L_2$ are a distance of closest approach.

Furthermore, since the wiring 7 has a two-stage structure composed of the first region 7a and the second region 7b, the embedding of the material at the time of forming the wiring is facilitated compared with the case where the distance of closest approach between the conductive members is decreased by decreasing the width of the entire wiring, and it is thereby possible to suppress deterioration of the electrical characteristics due to generation of voids in the wiring, etc.

Third Embodiment

The third embodiment is different from the first embodiment in the layout of the contact 4. The explanation will be omitted for the points same as the first embodiment.

Figure 9A:
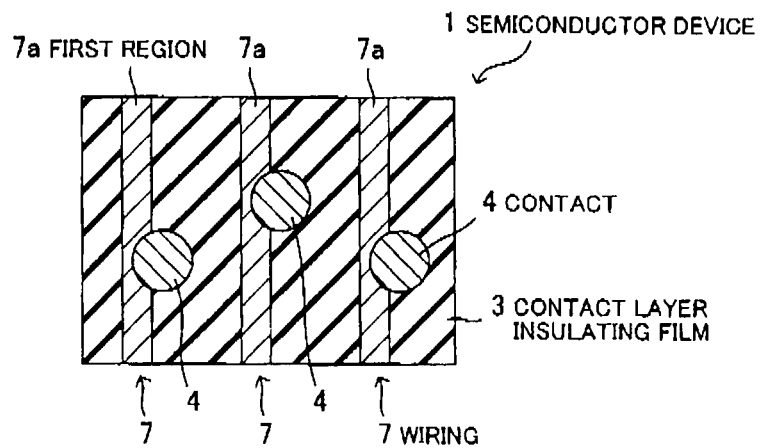
FIG. 9A and FIG. 9B are cross sectional views showing a semiconductor device according to a third embodiment.
Figure 9B:
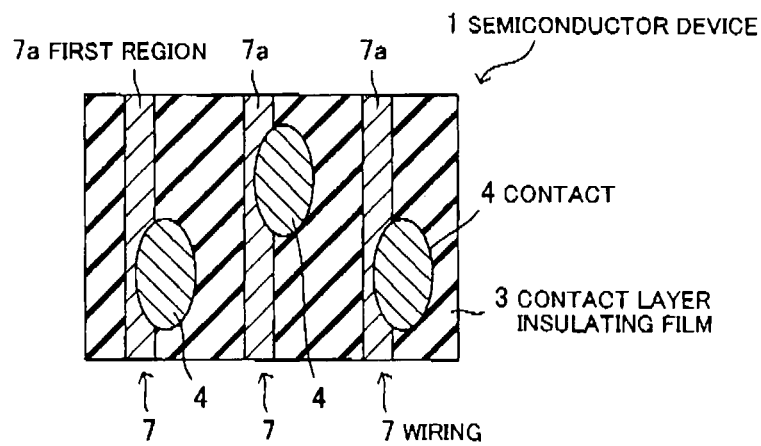

FIG. 9A and FIG. 9B are cross sectional views showing the semiconductor device according to a third embodiment. Here, cross sections of the semiconductor device 1 according to the present embodiment shown in FIG. 9A and FIG. 9B each correspond to the cross sections of the semiconductor device 1 according to the first embodiment shown in FIG. 2A and FIG. 2B.

Although the shape of the cross section of the contact 4 may be a nearly perfect circle as shown in FIG. 9A or an elliptical shape as shown in FIG. 9B, plural contacts 4 are not arranged in a row, but the adjacent contacts 4 are arranged shifting in a length direction of the wiring 7. According to such arrangement, it is possible to increase the distance between the adjacent contacts 4. Furthermore, lithography resolution is improved by alternately arranging the contacts 4, and it is capable of forming the contact 4 further smaller in size.

Figure 10A:
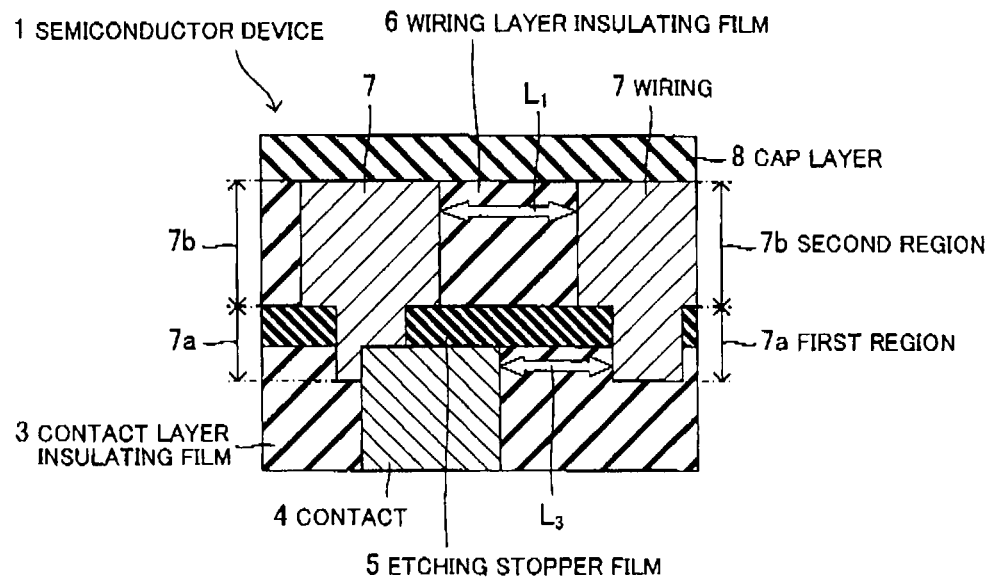
FIG. 10A is an enlarged partial view showing a periphery of a wiring of the semiconductor device according to the third embodiment and FIG. 10B is an enlarged partial view showing a periphery of a wiring of a semiconductor device which has a conventional wiring not having a two-stage structure as a third comparative example.
Figure 10B:
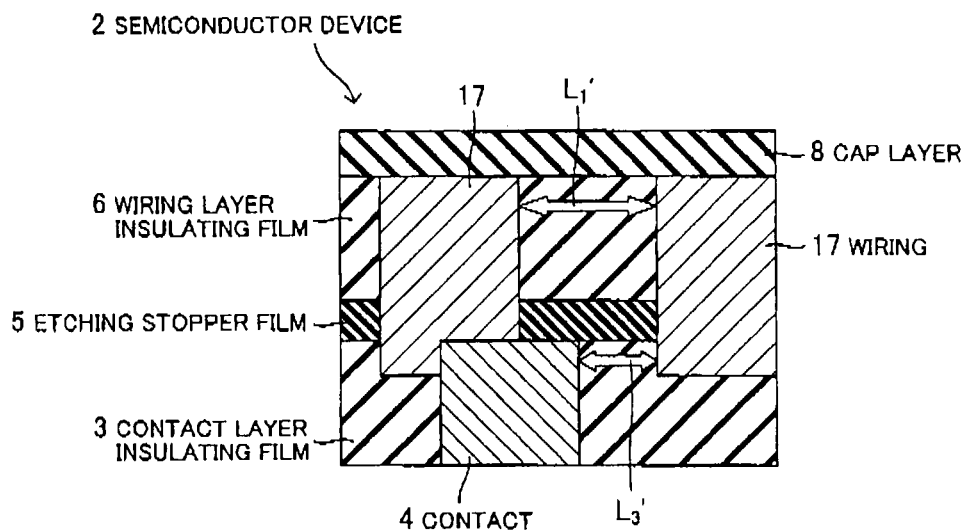

FIG. 10A is an enlarged partial view showing a periphery of the wiring 7 of the semiconductor device 1 according to the present embodiment. In addition, FIG. 10B is an enlarged partial view showing a periphery of a wiring 17 of a semiconductor device 2 which has a conventional wiring 17 not having a two-stage structure as a third comparative example. Here, cross sections of the semiconductor device 1 according to the present embodiment shown in FIG. 10A and FIG. 10B each correspond to the cross sections of the semiconductor device 1 according to the first embodiment shown in FIG. 3A and FIG. 3B. Note that, the semiconductor device 2 is totally same as the semiconductor device 1 in a structure and an arrangement of each member, etc., except a structure of the wiring.

Here, in the semiconductor device 1, a distance between the second regions 7b of the adjacent wirings 7 is an inter-wiring distance $L_1$ and a distance between the contact 4 and the first region 7a of the adjacent wiring 7 is a contact-to-wiring distance $L_3$. In the present embodiment, since the adjacent contacts 4 are arranged so as to be displaced in a length direction of the wiring 7, the inter-contact distance is increased and cannot be a distance of closest approach between the adjacent conductive members. Therefore, it is not necessary to take the inter-contact distance into consideration.

In addition, in the semiconductor device 2, a distance between the adjacent wirings 17 is an inter-wiring distance $L_1'$, and a distance between the contact 4 and the adjacent wiring 17 is a contact-to-wiring distance $L_3'$. Similarly to the semiconductor device 1, it is not necessary to take the inter-contact distance into consideration. In addition, the inter-wiring distance $L_1$ is equal to the inter-wiring distance $L_1'$.

Note that, in the semiconductor device 1 shown in FIG. 10A, a width of the second region 7b of the wiring 7 is equal to a diameter of the contact 4 in a width direction of the second region 7b. In addition, in the semiconductor device 2 shown in FIG. 10B, a width of the wiring 17 is equal to a diameter of the contact 4 in a width direction of the wiring 17.

In the semiconductor device 2 shown in FIG. 10B, the formation positions of the wiring 17 and the contact 4 are displaced, thus, the contact-to-wiring distance $L_3'$ is shorter than the inter-wiring distance $L_3'$. In other words, the contact-to-wiring distance $L_3'$ is a distance of closest approach between the adjacent conductive members. Consequently, even if the inter-wiring distance $L_1'$ is set to be larger than a limit distance $L_{lim}$ which is a minimum distance for suppressing the generation of the leak current and the breakdown, the contact-to-wiring distance $L_3'$ may become shorter than the limit distance $L_{lim}$, ($L_3' < L_{lim} < L_1$).

Meanwhile, in the semiconductor device 1 according to the third embodiment shown in FIG. 10A, since the wiring 7 has a two-stage structure composed of the first region 7a and the second region 7b, the contact-to-wiring distance $L_3$ is larger than the contact-to-wiring distance $L_3'$ of the semiconductor device 2. The contact-to-wiring distance $L_3$ can be increased to be larger than the limit distance $L_{lim}$ by adjusting the width of the second region 7b ($L_{lim} < L_3 < L_1$).

Note that, in the semiconductor device 1 according to the present embodiment, when each of a width of the second region 7b of the wiring 7, a diameter of the contact 4 in the width direction of the second region 7b and a dimension of the inter-wiring distance L, is f, a width of the first region 7a of the wiring 7 is Xf (0<X<1), and a displacement of formation positions of the wiring 7 (the second region 7b) and the contact 4 in the width direction of the wiring 7 is Z, the contact-to-wiring distance $L_3$ as a distance of closest approach between the adjacent conductive members is represented by following formula (6).

$$L_3 = \frac{(3-x)}{2} f - z \quad (6)$$

In addition, in the semiconductor device 2, when each of a width of the wiring 17, a diameter of the contact 4 in the width direction of the wiring 17 and a dimension of the inter-wiring distance $L_1'$ is f and a displacement of formation positions of the wiring 17 and the contact 4 in the width direction of the wiring 17 is Z, the contact-to-wiring distance $L_3'$ is represented by following formula (7).

$$L_3' = f - Z \quad (7)$$

Therefore, in this case, compared with the semiconductor device 2, the distance of closest approach between the adjacent conductive members in the semiconductor device 1 is larger by ΔL, which is represented by following formula (8).

$$\Delta L = L_3 - L_3' = \frac{(1-x)}{2} f \quad (8)$$

Alternatively, in the semiconductor device 1, the width of the second region 7b of the wiring 7 is not necessarily equal to the diameter of the contact 4 in the width direction of the second region 7b as long as relations $L_{lim} < L_1$ and $L_{lim} < L_3$ are satisfied.

For example, the width of the second region 7b of the wiring 7 may be increased. Alternatively, for example, the diameter of the contact 4 in the width direction of the wiring 7 may be increased. The effect of increasing the width of the second region 7b of the wiring 7 or the diameter of the contact 4 in the width direction of the wiring 7 is same as the first embodiment.

Effect of the Third Embodiment

According to the semiconductor device 1 of the third embodiment, since the wiring 7 has a two-stage structure composed of the first region 7a and the second region 7b, even when the displacement of the formation positions of the wiring 7 and the contact 4 occurs, it is possible to suppress the generation of the leak current and the breakdown by increasing the contact-to-wiring distance $L_3$ which is a distance of closest approach between the conductive members.

Furthermore, since the wiring 7 has a two-stage structure composed of the first region 7a and the second region 7b, the embedding of the material at the time of forming the wiring is facilitated compared with the case where the distance of closest approach between the conductive members is decreased by decreasing the width of the entire wiring, and it is thereby possible to suppress deterioration of the electrical characteristics due to generation of voids in the wiring, etc, Fourth Embodiment The fourth embodiment is different from the second embodiment in the layout of the contact 4e. The explanation will be omitted for the points same as the second embodiment.

Figure 11A:
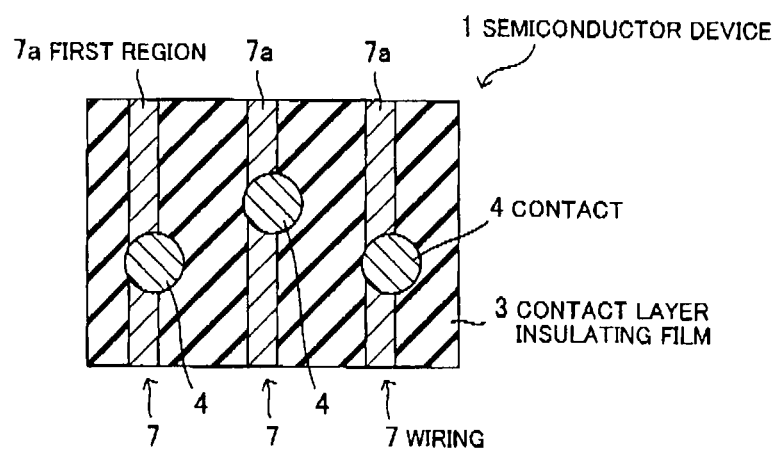
FIG. 11A and FIG. 11B are cross sectional views showing a semiconductor device according to a fourth embodiment.
Figure 11B:
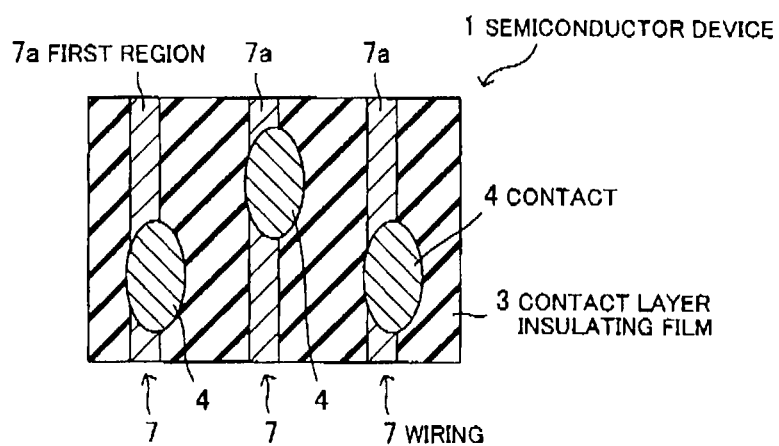

FIG. 11A and FIG. 11B are cross sectional views showing the semiconductor device according to the fourth embodiment. Here, cross sections of the semiconductor device 1 according to the present embodiment shown in FIG. 11A and FIG. 11B each correspond to the cross sections of the semiconductor device 1 according to the first embodiment shown in FIG. 2A and FIG. 2B.

Although the shape of the cross section of the contact 4 may be a nearly perfect circle as shown in FIG. 11A or an elliptical shape as shown in FIG. 11B, plural contacts 4 are not arranged in a row, but the adjacent contacts 4 are arranged shifting in a length direction of the wiring 7. According to such arrangement, it is possible to increase the distance between the adjacent contacts 4. Furthermore, lithography resolution is improved by alternately arranging the contacts 4, and it is capable of forming the contact 4 further smaller in size.

Figure 12A:
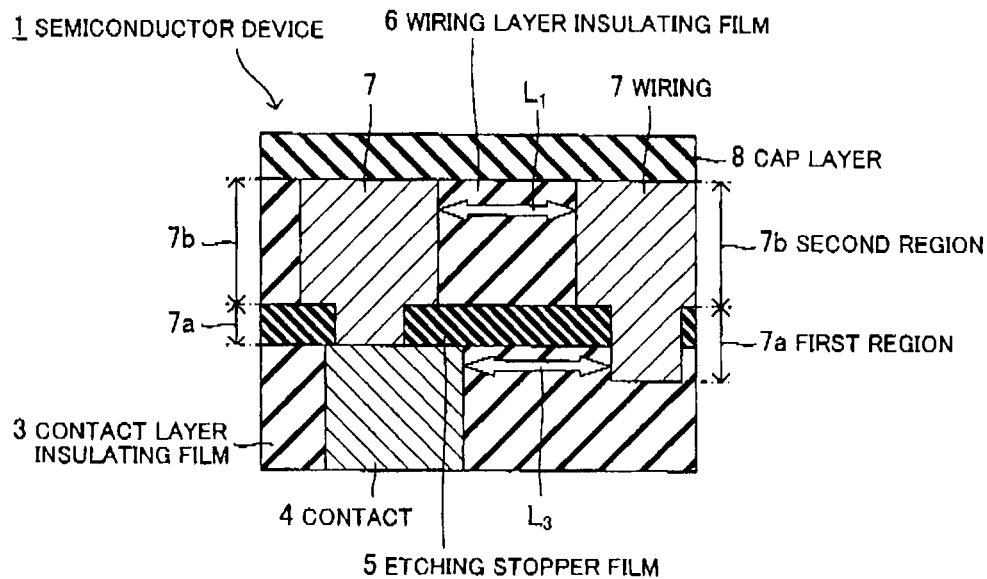
FIG. 12A is an enlarged partial view showing a periphery of a wiring of the semiconductor device according to the fourth embodiment and FIG. 12B is an enlarged partial view showing a periphery of a wiring of a semiconductor device which has a conventional wiring not having a two-stage structure as a fourth comparative example.
Figure 12B:
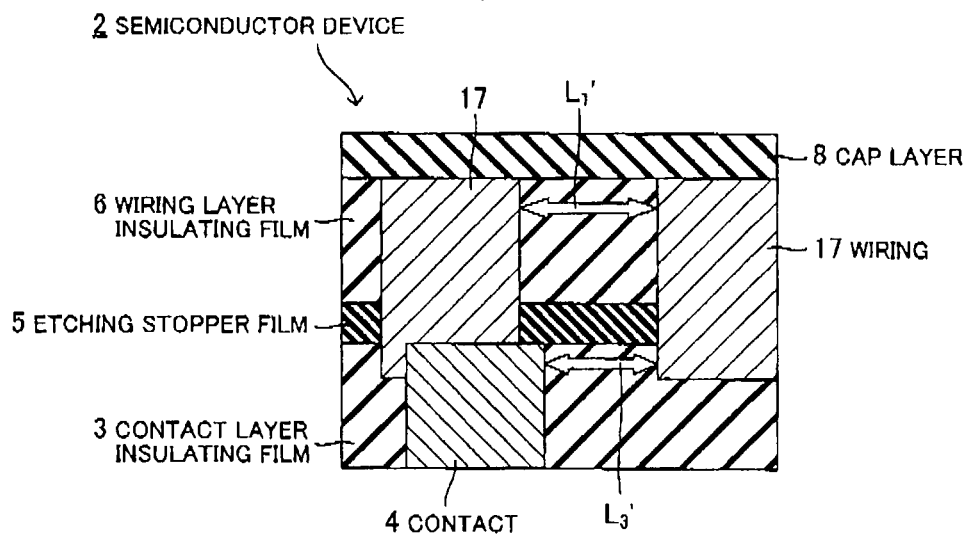

FIG. 12A is an enlarged partial view showing a periphery of the wiring 7 of the semiconductor device 1 according to the present embodiment. In addition, FIG. 12B is an enlarged partial view showing a periphery of a wiring 17 of a semiconductor device 2 which has a conventional wiring 17 not having a two-stage structure as a fourth comparative example. Here, cross sections of the semiconductor device 1 according to the present embodiment shown in FIG. 12A and FIG. 12B each correspond to the cross sections of the semiconductor device 1 according to the first embodiment shown in FIG. 3A and FIG. 3B. Note that, since the semiconductor device 2 is totally same as the semiconductor device 1 in a structure and an arrangement of each members etc., except a structure of the wiring.

Here, in the semiconductor device 1, a distance between the second regions 7b of the adjacent wirings 7 is an inter-wiring distance $L_1$ and a distance between the contact 4 and the first region 7a of the adjacent wiring 7 is a contact-to-wiring distance $L_3$. In the present embodiment, since the adjacent contacts 4 are arranged so as to be displaced in a length direction of the wiring 7, the inter-contact distance is increased and cannot be a distance of closest approach between the adjacent conductive members. Therefore, it is not necessary to take the inter-contact distance into consideration.

In addition, in the semiconductor device 2, a distance between the adjacent wirings 17 is an inter-wiring distance $L_1'$, and a distance between the contact 4 and the adjacent wiring 17 is a contact-to-wiring distance $L_3'$. Similarly to the semiconductor device 1, it is not necessary to take the inter-contact distance into consideration. In addition, the inter-wiring distance $L_1$ is equal to the inter-wiring distance $L_1'$.

Note that, in the semiconductor device 1 shown in FIG. 12A, a width of the second region 7b of the wiring 7 is equal to a diameter of the contact 4 in a width direction of the second region 7b. In addition, in the semiconductor device 2 shown in FIG. 12B, a width of the wiring 17 is equal to a diameter of the contact 4 in a width direction of the wiring 17.

In the semiconductor device 2 shown in FIG. 12B, the formation positions of the wiring 17 and the contact 4 are displaced, thus, the contact-to-wiring distance $L_3'$ is shorter than the inter-wiring distance $L_1'$. In other words, the contact-to-wiring distance $L_3'$ is a distance of closest approach between the adjacent conductive members. Consequently, even if the inter-wiring distance $L_1'$ is set to be larger than a limit distance $L_{lim}$, which is a minimum distance for suppressing the generation of the leak current and the breakdown, the contact-to-wiring distance $L_3'$ may become shorter than the limit distance $L_{lim}$ ($L_3'<L_{lim}<L_1'$).

Meanwhile, in the semiconductor device 1 according to the fourth embodiment shown in FIG. 12A, since the wiring 7 has a two-stage structure composed of the first region 7a and the second region 7b, the contact-to-wiring distance $L_3$ is larger than the contact-to-wiring distance $L_3'$ of the semiconductor device 2. In the present embodiment, since the first region 7a of the wiring 7 is not displaced from the top of the contact 4 in a width direction in a region to which the contact 4 is connected, the contact-to-wiring distance $L_3$ is less than or equal to the inter-wiring distance $L_1'$. Therefore, when the inter-wiring distance $L_1'$ is set to be larger than a limit distance blip which is a minimum distance for suppressing the generation of the leak current and the breakdown, it is possible to make the distance of closest approach between the conductive members larger than the limit distance $L_{lim}$ ($L_{lim}<L_1 \leq L_3$).

Note that, in the semiconductor device 1 according to the present embodiment, when each of a width of the second region 7b of the wiring 7, a diameter of the contact 4 in the width direction of the second region 7b and a dimension of the inter-wiring distance $L_1$ is f, a width of the first region 7a of the wiring 7 is Xf (0<X<1), and a displacement of formation positions of the wiring 7 (the second region 7b) and the contact 4 in the width direction of the wiring 7 is Z, the distance of closest approach between the adjacent conductive members is f, which is the inter-wiring distance $L_1$.

In addition, in the semiconductor device 2, when each of a width of the wiring 17, a diameter of the contact 4 in the width direction of the wiring 17 and a dimension of the inter-wiring distance $L_1'$ is f and a displacement of formation positions of the wiring 17 and the contact 4 in the width direction of the wiring 17 is Z, the contact-to-wiring distance $L_3'$ is represented by following formula (9).

$$L_3' = f - Z \quad (9)$$

Therefore, in this case, compared with the semiconductor device 2, the distance of closest approach between the adjacent conductive members in the semiconductor device 1 is larger by ΔL, which is represented by following formula (10).

$$\Delta L = L_1 - L_3' = Z \quad (10)$$

Alternatively, in the semiconductor device 1, the width of the second region 7b of the wiring 7 is not necessarily equal to the diameter of the contact 4 in the width direction of the second region 7b as long as relations $L_{lim}<L_1$ and $L_{lim}<L_3$ are satisfied.

For example, the width of the second region 7b of the wiring 7 may be increased. Alternatively, for example, the diameter of the contact 4 in the width direction of the wiring 7 may be increased. The effect of increasing the width of the second region 7b of the wiring 7 or the diameter of the contact 4 in the width direction of the wiring 7 is same as the first embodiment.

Effect of the Fourth Embodiment

According to the semiconductor device 1 of the fourth embodiment, since the wiring 7 has a two-stage structure composed of the first region 7a and the second region 7b, even when the displacement of the formation positions of the wiring 7 and the contact 4 occurs, the distance of closest approach between the adjacent conductive members is not the contact-to-wiring distance but the inter-wiring distance $L_1$, it is thereby possible to suppress the generation of the leak current and the breakdown.

Furthermore, since the wiring 7 has a two-stage structure composed of the first region 7a and the second region 7b, the embedding of the material at the time of forming the wiring is facilitated compared with the case where the distance of closest approach between the conductive members is decreased by decreasing the width of the entire wiring, and it is thereby possible to suppress deterioration of the electrical characteristics due to generation of voids in the wiring, etc.

Fifth Embodiment

The fifth embodiment is different from the first embodiment in a shape of the wiring. The explanation will be omitted for the points same as the first embodiment.

Figure 13A:
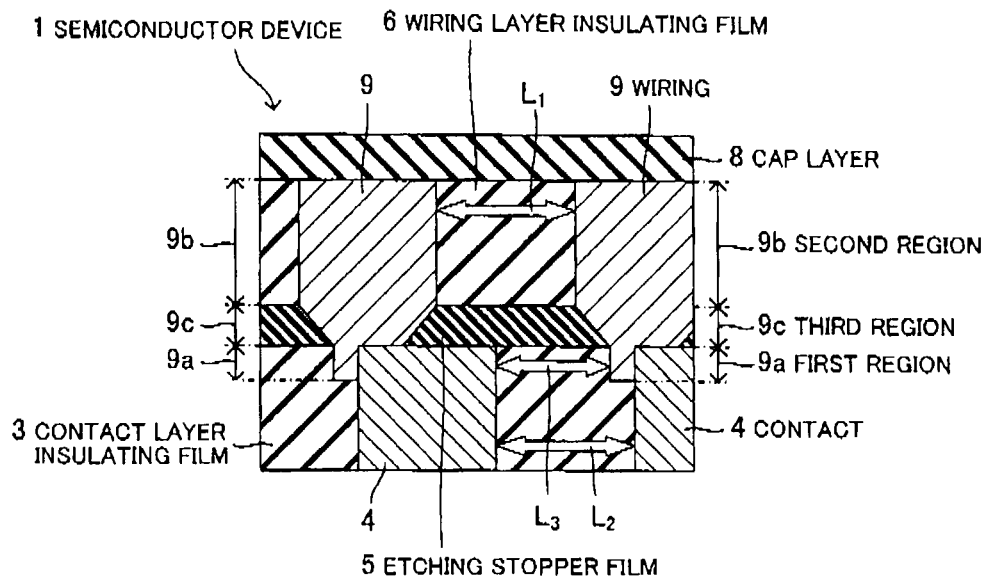
FIG. 13A and FIG. 13B are enlarged partial views showing a periphery of a wiring of a semiconductor device according to a fifth embodiment.
Figure 13B:
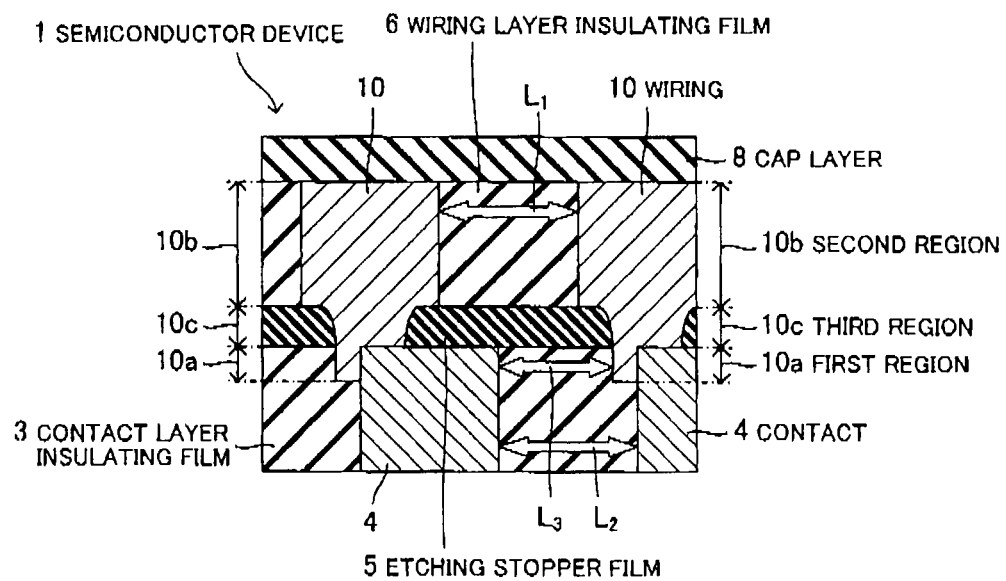

FIG. 13A and FIG. 13B are enlarged partial views each showing a periphery of the wiring 7 of the semiconductor device 1 according to the present embodiment. Here, cross sections of the semiconductor device 1 according to the embodiment shown in FIG. 13A and FIG. 13B each correspond to the cross sections of the semiconductor device 1 according to the first embodiment shown in FIG. 3A.

The semiconductor device 1 shown in FIG. 13A has a wiring 9 having a three-stage structure composed of a first region 9a, a second region 9b and a third region 9c. The first region 9a is a region located lower than a height of a bottom surface of the etching stopper film 5, and contacts with a portion of the side face of the contact 4. In addition, the second region 9b is a region located higher than the height of the upper surface of the etching stopper film 5, and has a width larger than that of the first region 9a.

The third region 9c is located between the first region 9a and the second region 9b, and contacts with a portion of the upper surface of the contact 4. In addition, the third region 9c is a taper shaped region having a width substantially equal to that of the first region 9a at the vicinity of a boundary with the first region 9a as well as having a width substantially equal to that of the second region 9b at the vicinity of a boundary with the second region 9b. Note that, in order to improve the embedding property of the wiring material, it is preferable that a taper angle of the third region 9c (an angle defined by a height direction of the first region 9a) is, e.g., 87° or more. In the meantime, the taper shape does not include a shape formed by a slant which is naturally formed on the etching stopper film 5 when the etching stopper film 5 is etched for forming the wiring trench 7c. Note that, the first region 9a may be a taper shape continuous to the third region 9c.

The semiconductor device 1 shown in FIG. 13B has a wiring 10 having a three-stage structure composed of a first region 10a, a second region 10b and a third region 10c. The first region 10a and the second region 10b are equivalent to the first region 9a and the second region 9b of the wiring 9.

The third region 10c is located between the first region 10a and the second region 10b, and contacts with a portion of the upper surface if the contact 4. In addition, the third region 10c is an inverted round shaped (a concave shape comprising a curved surface) region having a width substantially equal to that of the first region 10a at the vicinity of a boundary with the first region 10a as well as having a width substantially equal to that of the second region 10b at the vicinity of a boundary with the second region 10b.

Note that, the first region 9a of the wiring 9 and the first region 10a of the wiring 10 are equivalent to the first region 7a of the wiring 7 in the semiconductor device 1 according to the first embodiment, and the second region 9b of the wiring 9 and the second region 10b of the wiring 10 are equivalent to the second region 7b of the wiring 7 in the semiconductor device 1 according to the first embodiment. Therefore, the relation between the inter-wiring distance $L_1$, the inter-contact distance $L_2$ and the contact-to-wiring distance $L_3$ in the semiconductor device 1 according to the present embodiment shown in FIGS. 13A and 13B is same as the first embodiment.

An example of the processes for fabricating the semiconductor device 1 according to the present embodiment will be described hereinafter.

Figure 14A:
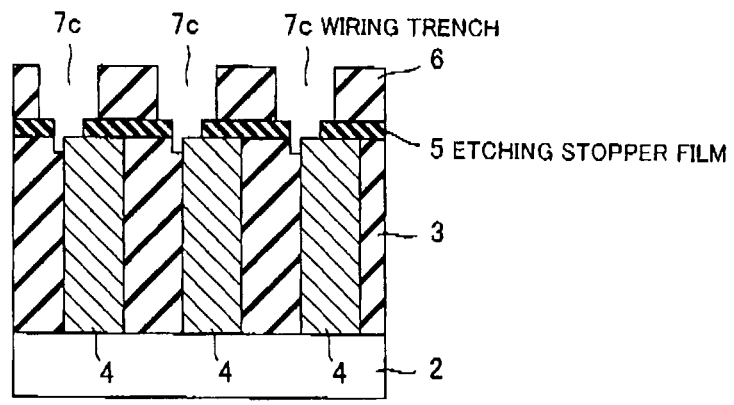
FIG. 14A to FIG. 14C are cross sectional views showing processes for fabricating the semiconductor device according to the fifth embodiment.
Figure 14B:
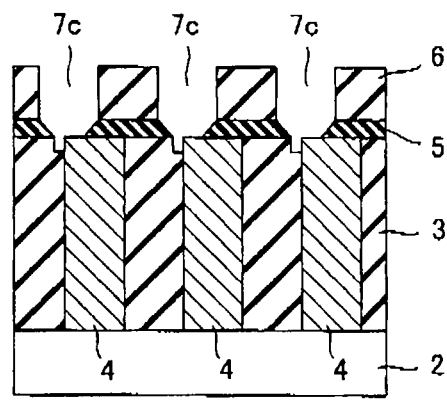
Figure 14C:
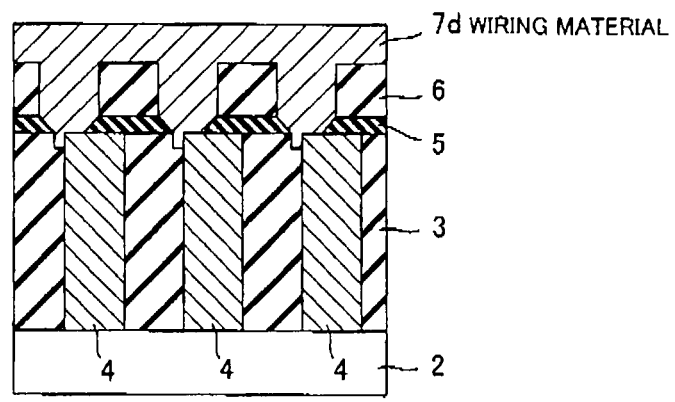

FIG. 14A to FIG. 14C are cross sectional views showing processes for fabricating the semiconductor device according to the fifth embodiment.

Firstly, as shown in FIG. 14A, the processes until the process shown in FIG. 5D for increasing a width of a region of the wiring trench 7c located higher than the upper surface of the etching stopper film 5, are carried out in the same way as the first embodiment.

Next, as shown in FIG. 14B, a taper machining is applied to a portion of the etching stopper film 5 exposed by the wiring trench 7c, In the method of the taper machining, an etching by-product is attached on a surface of the etching stopper film 5 during the etching of the etching stopper film 5 by, e.g., selecting an appropriate type of etching gas or adjusting a bias power, thereby forming the taper shape.

Next, as shown in FIG. 14C, the wiring material 7d for forming the wiring 9 is formed in the wiring trench 7c, Subsequent processes are same as the first embodiment.

Note that, although it is not illustrated, when the wiring 10 is formed, a round machining is applied to a portion of the etching stopper film 5 exposed by the wiring trench 7c during the process shown in FIG. 14B, instead of applying the taper machining.

Alternatively, the semiconductor device 1 according to the present embodiment may be formed by a method shown in FIG. 15A to FIG. 15C, as described below.

Firstly, the processes until the process, shown in FIG. 5A, for forming the wiring layer insulating film 6 are carried out in the same way as the first embodiment.

Figure 15A:
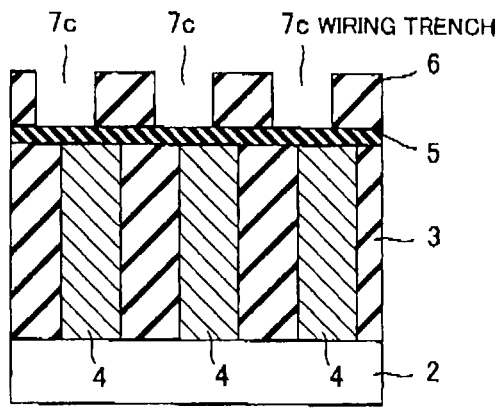
FIG. 15A to FIG. 15C are cross sectional views showing processes for fabricating the semiconductor device according to the fifth embodiment.

Next, as shown in FIG. 15A, a wiring trench 7c for the wiring 7 is formed in the wiring layer insulating film 6 by patterning the wiring layer insulating film 6 by, e.g., the photolithographic method and the RIE method, Here, by adjusting the width of the wiring trench 7c, the second region 9b (the second region 10b) of the wiring 9 (the wiring 10), which is formed in a posterior process, can be formed in a desired width. At this time, the depths of the wiring trenches 7c are equalized by the etching stopper film 5.

Figure 15B:
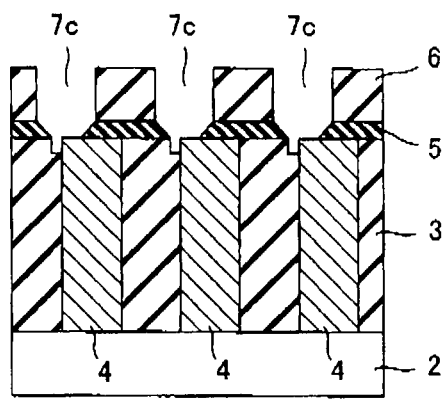

Next, as shown in FIG. 15B, taper machining or round machining is applied to the etching stopper film 5. At this time, the wiring trench 7c is deepened and at least a portion of the upper surface of the contact 4 is exposed. Here, by adjusting the width of the wiring trench 7c at the height level of the lower surface of the etching stopper film 5, the second region 9a (the second region 10a) of the wiring 9 (the wiring 10), which is formed in a posterior process, can be formed in a desired width.

Figure 15C:
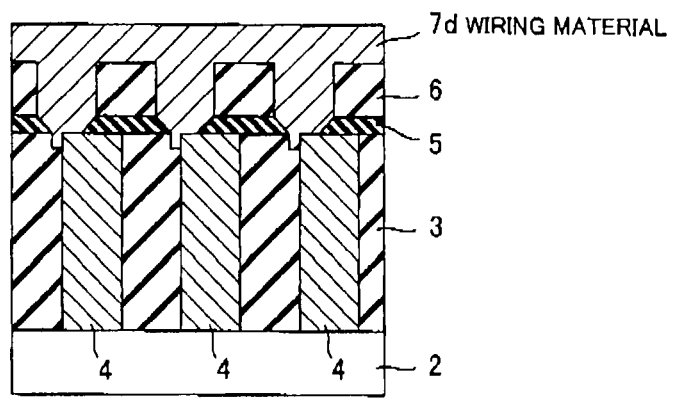

Next, as shown in FIG. 15C, the wiring material 7d for forming the wiring 9 is formed in the wiring trench 7c. Subsequent processes are same as the first embodiment.

Effect of the Fifth Embodiment

According to the semiconductor device 1 of the fifth embodiment, it is possible to suppress the generation of the leak current and the breakdown in the same way as the first embodiment. In addition, since the wiring 9 or the wiring 10 has the third region 9c in a taper shape or the third region 10c in an inverted round shape, the embedding of the material at the time of forming the wiring is further facilitated compared with the first embodiment, and it is thereby possible to suppress deterioration of the electrical characteristics due to generation of voids in the wiring, etc.

Note that, although the semiconductor device 1 shown in FIG. 13A and FIG. 13B is equivalent to the semiconductor device 1 according to the first embodiment to which the wiring 9 and the wiring 10 are applied, the structure of the semiconductor device 1 according to present embodiment is not limited thereto. For example, the semiconductor device 1 of this embodiment may be the semiconductor device 1 according to the second to fourth embodiments to which the wiring 9 and the wiring 10 are applied, Note that, the relation between the inter-wiring distance $L_1$, the inter-contact distance $L_2$ and the contact-to-wiring distance $L_3$ is same as each embodiment, even in these cases.

Sixth Embodiment

The sixth embodiment is to define in detail the structure of the wiring in the first to fifth embodiments. Note that, since the configurations other than the wiring are same as the first to fifth embodiments, the explanation will be omitted.
(Structure of Wiring)

Figure 16A:
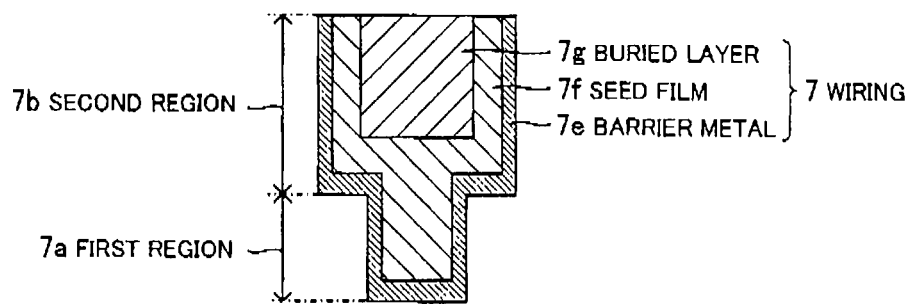
FIG. 16A and FIG. 16B are cross sectional views showing a wiring of a semiconductor device according to a sixth embodiment.
Figure 16B:
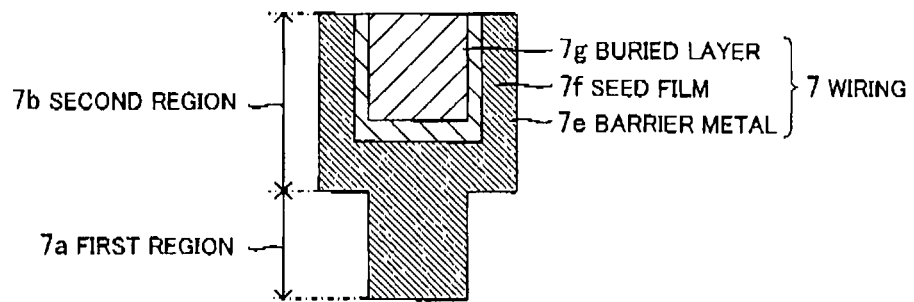

Each of FIG. 16A and FIG. 16B is cross sectional view showing a wiring of the semiconductor device according to present embodiment. The wiring 7 is made of a barrier metal 7e, a seed film 7f as a current supply layer for metal plating and a buried film 7g.

FIG. 16A shows a structure of the wiring 7 in the first to fourth embodiments when the first region 7a of the wiring 7 is composed of only the barrier metal 7e and the seed film 7f without including the buried film 7g. In addition, FIG. 16B shows a structure of the wiring 7 when the first region 7a is composed of only the barrier metal 7e without including the seed film 7f and the buried film 7g.

Here, the barrier metal 7e is made of, e.g., a metal such as Ta, Ti, W, Ru or Mn, etc, or a compound thereof, and is formed by the sputtering method or the CVD method. Meanwhile, the seed film 7f is made of a conductive material same as the buried film 7g such as, e.g., Cu., etc., and is formed by the sputtering method or the CVD method. In addition, the buried film 7g is made of a conductive material such as, e.g., Cu., etc., and is formed by plating.

In general, a film formed by the sputtering method grows faster from a bottom surface of a trench than from an inner side surface of the trench. The barrier metal 7e and the seed film 7f are, or, the barrier metal 7e is filled into the first region 7a using high growth rate from the bottom surface by the sputtering method. Since the film formed by the sputtering method is dense in a film density and contains few impurities, it is possible to suppress generation of voids in the first region 7a.

Furthermore, in the CVD method, it is generally easy to embed a film also into a region which has relatively large aspect ratio (height/width). Therefore, it is possible to suppress the generation of voids in the first region 7a by filling the first region 7a with the barrier metal 7e and the seed film 7f, or the barrier metal 7e formed by the CVD method.

In addition, when present embodiment is applied to the wiring 9 or the wiring 10 of the fifth embodiment, the wiring 9 or the wiring 10 has a structure in which the first region 9a or the first region 10a is made of only a barrier metal and a seed film, and not includes a buried film. Alternatively, the wiring 9 or the wiring 10 has a structure in which the first region 9a or the first region 10a is made of only a barrier metal, and not includes a seed film and a buried film.

Effect of the Sixth Embodiment

According to the wiring in the sixth embodiment, it is possible to suppress the generation of voids in the first region 7a by filling the first region 7a with the barrier metal 7e and the seed film 7f, or, the barrier metal 7e formed by the sputtering method or the CVD method.

Furthermore, an aspect ratio of a region into which the buried film 7g is embedded is decreased by filling the first region 7a with the barrier metal 7e and the seed film 7f, or, the barrier metal 7e, and it is thereby possible to facilitate the embedding of the buried film 7g.

Furthermore, as shown in FIG. 16B, when the first region 7a is filled with only the barrier metal 7e, even if the voids are generated in the first region 7a, since the voids in a barrier metal such as Ta, etc., is inactive, the voids do not move into the second region 7b. Therefore, in the structure of FIG. 16B, the reliability is less deteriorated even when the voids are generated.

Note that, FIG. 16A and FIG. 16B show cross sections of a region to which the contact 4 of the wiring 7 is not connected, and the first region 7a is filled with the barrier metal 7e and the seed film 7f, or, with the barrier metal 7e even in the region to which the contact 4 is not connected, in the same way. The same applies to the case where the sixth embodiment is applied to the wiring 9 or the wiring 10 of the fifth embodiment.

Other Embodiments

It should be noted that the embodiment is not intended to be limited to the above-mentioned first to fourth embodiments, and the various kinds of changes thereof can be implemented by those skilled in the art without departing from the gist of the invention. For example, in the semiconductor devices 1, a wiring structure described in the above-mentioned each embodiment can be applied to a microscopic wiring structure in an element portion, etc., and a conventional wiring structure can be applied to a wiring structure which is not very microscopic such as a peripheral circuit portion, etc. This is because, since voltage endurance characteristics and leak-resistant characteristics are less problematic when the wiring structure is not microscopic, it is not necessary to increase a distance of closest approach between adjacent conductive members by forming a wiring having a structure composed of the first region 7a and the second region 7b or a structure composed of the first regions 9a, 10a, the second regions 9b, 10b and the third regions 9c, 10c as descried in the above-mentioned each embodiment. In addition, when the structure of the wiring is a conventional structure in which a cross section of the wiring is square, it is possible to reduce electrical resistance by an increase in the volume.

In addition, the constituent elements of the above-mentioned embodiments can be arbitrarily combined with each other without departing from the gist of the invention.

What is claimed is:

1. A semiconductor device, comprising:
a semiconductor substrate provided with a semiconductor element;
a connecting member formed above the semiconductor substrate, having a planar shape of a circle or an ellipse, and configured to electrically connect upper and lower conductive members;
a first insulating film formed in the same layer as the connecting member;
a wiring formed on the connecting member, the wiring having a length direction and a width direction and including a first region and a second region, each of the first and second regions extending in the length direction and having a length greater than a diameter of the circle or a major axis length of the ellipse, the first region contacting with a portion of an upper surface of the connecting member and including a first portion and a second portion, the second region being located on the first region and having a width greater than a width of the first region, the first portion being located between the connecting member and the second region, the second portion being located between the first insulating film and the second region, and a portion of the wiring being in contact with a side of the connecting member; and
a second insulating film formed on the first insulating film so as to contact with at least a portion of the first region of the wiring and with a bottom surface of the second region of the wiring.

2. The semiconductor device according to claim 1, wherein the connecting member is arranged so as to be displaced from another connecting member adjacent thereto in a length direction of the wiring.

3. The semiconductor device according to claim 1, wherein the connecting member connects the wiring in an upper layer with the conductive member in an lower layer, and the conductive member in the lower layer is a source/drain region of a transistor, a contact portion of a gate electrode or a wiring.

4. The semiconductor device according to claim 1, wherein the second insulating film has a function as an etching stopper film when forming a wiring trench for the wiring in an insulating film on the second insulating film by etching.

5. The semiconductor device according to claim 1, wherein a width of the second region is substantially equal to a diameter of the connecting member in a width direction of the wiring.

6. The semiconductor device according to claim 1, wherein a width of the second region is greater than a diameter of the connecting member in a width direction of the wiring.

7. A semiconductor device, comprising:
a semiconductor substrate provided with a semiconductor element;

a connecting member formed above the semiconductor substrate, having a planar shape of a circle or an ellipse, and configured to electrically connect upper and lower conductive members;

a first insulating film formed in the same layer as the connecting member;

a wiring formed on the connecting member, the wiring having a length direction and a width direction and including a first region, a second region and a third region, each of the first, second, and third regions extending in the length direction and having a length greater than a diameter of the circle or a major axis length of the ellipse, the first region contacting with a portion of an upper surface of the connecting member and including a first portion and a second portion, the second region being located on the first region and having a width greater than a width of the first region, the third region being located between the first region and the second region and having a concave shape with a curved surface or a taper shape, the first portion being located between the connecting member and the third region, the second portion being located between the first insulating film and the third region, and a portion of the wiring being in contact with a side of the connecting member; and a second insulating film formed on the first insulating film so as to contact with the third region of the wiring.

8. The semiconductor device according to claim 7, wherein the connecting member is arranged so as to be displaced from another connecting member adjacent thereto in a length direction of the wiring.

9. The semiconductor device according to claim 7, wherein the connecting member connects the wiring in an upper layer with the conductive member in an lower layer, and the conductive member in the lower layer is a source/drain region of a transistor, a contact portion of a gate electrode or a wiring.

10. The semiconductor device according to claim 7, wherein the second insulating film has a function as an etching stopper film when forming a wiring trench for the wiring in an insulating film on the second insulating film by etching.

11. The semiconductor device according to claim 7, wherein a width of the second region is substantially equal to a diameter of the connecting member in a width direction of the wiring.

12. The semiconductor device according to claim 7, wherein a width of the second region is greater than a diameter of the connecting member in a width direction of the wiring.

13. A semiconductor device, comprising:
a semiconductor substrate provided with a semiconductor element;

a first and second connecting member formed above the semiconductor substrate, having planar shapes of circles or ellipses, and configured to electrically connect upper and lower conductive members, respectively;

a first insulating film formed in the same layer as the first and second connecting members;

a first wiring formed on the first connecting member, the first wiring having a length direction and a width direction and including a first region and second region, each of the first and second regions extending in the length direction and having a length greater than diameters of the circles or major axis lengths of the ellipses, the first region contacting with a portion of an upper surface of the first connecting member and including a first portion and a second portion, the second region being located on the first region and having a width greater than a width of the first region, the first portion being located between the first connecting member and the second region, the second portion being located between the first insulating film and the second region, and a portion of the first wiring being in contact with a side of the first connecting member;

a second wiring formed on the second connecting member, the second wiring having a length direction and a width direction and including a first region and second region, each of the first and second regions extending in the length direction and having a length greater than diameters of the circles or major axis lengths of the ellipses, the first region contacting with a portion of an upper surface of the second connecting member and including a first portion and a second portion, the second region being located on the first region and having a width greater than a width of the first region, the first portion being located between the second connecting member and the second region, the second portion being located between the first insulating film and the second region, a portion of the second wiring being in contact with a side of the second connecting member, and the second wiring being provided adjacent to the first wiring and substantially parallel to the first wiring; and a second insulating film formed on the first insulating film so as to contact with at least a portion of the first region of the first wiring and a portion of the first region of the second wiring and with bottom surfaces of the second regions of the first wiring and the second wiring;

wherein a horizontal distance from the first connecting member to the first region of the second wiring is greater than a horizontal distance from the first connecting member to the second region of the second wiring.

* * * * *